(12) United States Patent
Kim

(10) Patent No.: US 12,426,458 B2
(45) Date of Patent: Sep. 23, 2025

(54) DISPLAY DEVICE AND METHOD FOR MANUFACTURING THE SAME

(71) Applicant: Samsung Display Co., Ltd., Yongin-si (KR)

(72) Inventor: Byoungyong Kim, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 545 days.

(21) Appl. No.: 17/746,893

(22) Filed: May 17, 2022

(65) Prior Publication Data

US 2022/0406873 A1    Dec. 22, 2022

(30) Foreign Application Priority Data

Jun. 21, 2021    (KR) .................... 10-2021-0080311

(51) Int. Cl.
*H10K 59/131*    (2023.01)
*H10K 59/12*    (2023.01)
*H10K 71/00*    (2023.01)

(52) U.S. Cl.
CPC ....... *H10K 59/131* (2023.02); *H10K 59/1201* (2023.02); *H10K 71/00* (2023.02)

(58) Field of Classification Search
CPC .. H10K 59/1201; H10K 59/40; H10K 59/131; H10K 77/00; H10K 77/10
See application file for complete search history.

(56) References Cited

U.S. PATENT DOCUMENTS

| | | | |
|---|---|---|---|
| 10,381,581 B2 | 8/2019 | Jeong et al. | |
| 10,436,991 B2 | 10/2019 | Jou et al. | |
| 10,439,720 B2 | 10/2019 | Jou et al. | |
| 10,476,185 B2 | 11/2019 | Kim et al. | |
| 2017/0332495 A1* | 11/2017 | Kim | H10D 99/00 |
| 2017/0373028 A1* | 12/2017 | Ryu | G09G 3/2092 |
| 2019/0196632 A1* | 6/2019 | Ryu | G06F 3/0412 |
| 2020/0119058 A1* | 4/2020 | Shin | H10D 86/60 |
| 2020/0203462 A1* | 6/2020 | Oh | H10K 59/40 |
| 2021/0066435 A1* | 3/2021 | Ryu | H10K 59/131 |

FOREIGN PATENT DOCUMENTS

| | | |
|---|---|---|
| KR | 10-2006-0096253 | 9/2006 |
| KR | 1020130109350 A | 10/2013 |
| KR | 10-1433111 | 8/2014 |
| KR | 10-2017-0140764 | 12/2017 |
| KR | 1020180034780 A | 4/2018 |
| KR | 1020190090102 A | 8/2019 |

* cited by examiner

*Primary Examiner* — Vongsavanh Sengdara
(74) *Attorney, Agent, or Firm* — CANTOR COLBURN LLP

(57) ABSTRACT

A display device includes a display panel having a display region and a pad region adjacent to the display region, and a circuit board electrically connected to the display panel, in which the display panel includes: a base substrate having an upper surface and a lower surface opposing the upper surface, the base substrate including a plurality of recessed patterns recessed from the lower surface; and a plurality of display pads disposed in the pad region and arranged in a first direction, and wherein at least one of the plurality of recessed patterns overlaps the pad region.

18 Claims, 17 Drawing Sheets

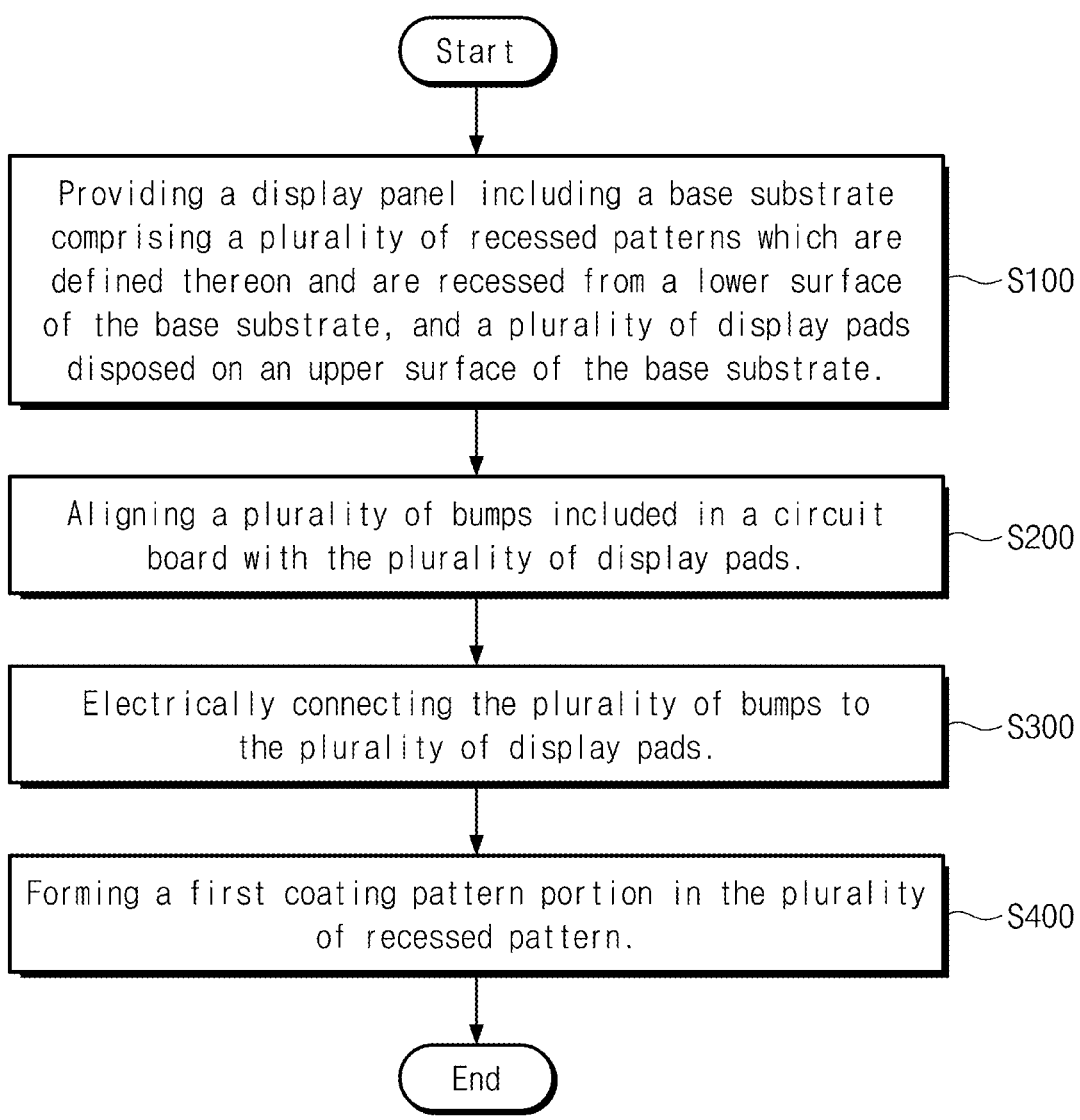

DISPLAY DEVICE AND METHOD FOR MANUFACTURING THE SAME

CROSS-REFERENCE TO RELATED APPLICATION

This application claims priority from and the benefit of Korean Patent Application No. 10-2021-0080311, filed on Jun. 21, 2021, which is hereby incorporated by reference for all purposes as if fully set forth herein.

BACKGROUND

Field

Embodiments of the invention relate generally to a display device and a method for manufacturing the display device and, more specifically, to a display device with an improved bonding connection between a display panel and a circuit board and a method of manufacturing the display device.

Discussion of the Background

A display device, such as a television, a monitor, a smart phone, and a tablet, for providing an image to a user includes a display panel for displaying the image. Various display panels, such as a liquid crystal display panel, an organic light emitting display panel, an electro wetting display panel, and an electrophoretic display panel, have been developed.

With the recent development of display device technology, a display device including a flexible display panel has been developed. The display panel includes a plurality of pixels for displaying an image and a driving chip for driving the pixels. The pixels are disposed in a display region of the display panel, and the driving chip is disposed in a non-display region of the display panel surrounding the display region. A bending portion is formed between the driving chip and the display region, and the bending portion is bent such that the driving chip is disposed below the display panel.

The above information disclosed in this Background section is only for understanding of the background of the inventive concepts, and, therefore, it may contain information that does not constitute prior art.

SUMMARY

Display devices constructed according to the principles of the invention are capable of improving and enhancing reliability of an electrical bonding connection between a display panel and a circuit board of the display devices.

Methods of manufacturing the display devices according to the principles of the invention are capable of improving and enhancing bonding reliability between the display panel and the circuit board of the display devices.

Additional features of the inventive concepts will be set forth in the description which follows, and in part will be apparent from the description, or may be learned by practice of the inventive concepts.

According to an aspect of the invention, a display device includes a display panel having a display region and a pad region adjacent to the display region, and a circuit board electrically connected to the display panel, wherein the display panel includes: a base substrate having an upper surface and a lower surface opposing the upper surface, the base substrate including a plurality of recessed patterns recessed from the lower surface; and a plurality of display pads disposed in the pad region and arranged in a first direction, and wherein at least one of the plurality of recessed patterns overlaps the pad region.

The plurality of recessed patterns may extend in the first direction, and be spaced apart along a second direction intersecting the first direction.

A depth of each of the plurality of recessed patterns may be less than a thickness of the base substrate.

Each of the plurality of display pads may include a first pad portion overlapping the plurality of recessed patterns, and a second pad portion not overlapping the plurality of recessed patterns.

The circuit board may include a plurality of bumps respectively overlapping the plurality of display pads, wherein each of the plurality of bumps may be in contact with each of the plurality of display pads.

The display device may further include a non-conductive layer disposed between the circuit board and the display panel.

The display panel may further include a first coating pattern portion filled in the plurality of recessed patterns, wherein a height of the first coating pattern portion may be substantially same as a depth of the plurality of recessed patterns.

The first coating pattern portion may include a first sub-coating pattern portion disposed below the plurality of display pads, and a second sub-coating pattern portion disposed below the first sub-coating pattern portion, wherein a hardness of the second sub-coating pattern may be greater than a hardness of the first sub-coating pattern.

The base substrate may include a first substrate disposed below the plurality of display pads, and a second substrate disposed below the first substrate, wherein each of the plurality of recessed patterns may be formed in the second substrate.

Each of the plurality of recessed patterns may be formed to penetrate the second substrate.

Each of the plurality of recessed patterns may be recessed from a lower surface of the second substrate, and a depth of each of the plurality of recessed patterns may be less than a thickness of the second substrate.

The plurality of recessed patterns may not overlap the plurality of display pads, may extend in the second direction intersecting the first direction, and may be spaced apart from each other in the first direction.

The display panel may further include a second coating pattern portion filled in the plurality of recessed patterns.

Each of the plurality of recessed patterns may extend in a first sub-direction inclined at a predetermined angle with respect to the first direction.

According to another aspect of the invention, a display device includes: a circuit board; and a display panel electrically connected to the circuit board, the display panel including a base substrate having an upper surface and a lower surface opposing the upper surface, the base substrate including a plurality of recessed patterns recessed from the lower surface of the base substrate, and a plurality of display pads disposed on the upper surface of the base substrate and arranged in a first direction, wherein the base substrate includes a plurality of convex patterns formed between the plurality of recessed patterns, and wherein at least a portion of each of the plurality of convex patterns overlaps the plurality of display pads on a plane.

The plurality of recessed patterns may extend in the first direction, and be spaced apart from each other in a second direction intersecting the first direction.

Each of the plurality of display pads may include a first pad portion not overlapping the plurality of convex patterns, and a second pad portion overlapping the plurality of convex patterns.

Each of the plurality of convex patterns may overlap the plurality of display pads, may be spaced apart from each other in the first direction, and may extend in the second direction intersecting the first direction.

The display device may further include a non-conductive layer disposed between the circuit board and the display panel.

According to another aspect of the invention, a method of manufacturing a display device includes the steps of providing a display panel including: a base substrate having an upper surface and a lower surface opposing the upper surface, the base substrate including a plurality of recessed patterns recessed from the lower surface, and a plurality of display pads disposed on the upper surface of the base substrate, providing a circuit board including a plurality of bumps overlapping the plurality of display pads, applying thermal pressure to the circuit board to electrically connect the plurality of bumps to the plurality of display pads, and forming a first coating pattern portion in the plurality of recessed pattern, wherein at least a portion of each of a plurality of convex patterns formed between the plurality of recessed patterns overlaps the plurality of display pads.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

FIG. 12 is a flowchart showing a method of manufacturing the display device of FIG. 1 according to an embodiment.

DETAILED DESCRIPTION

Figure 1:
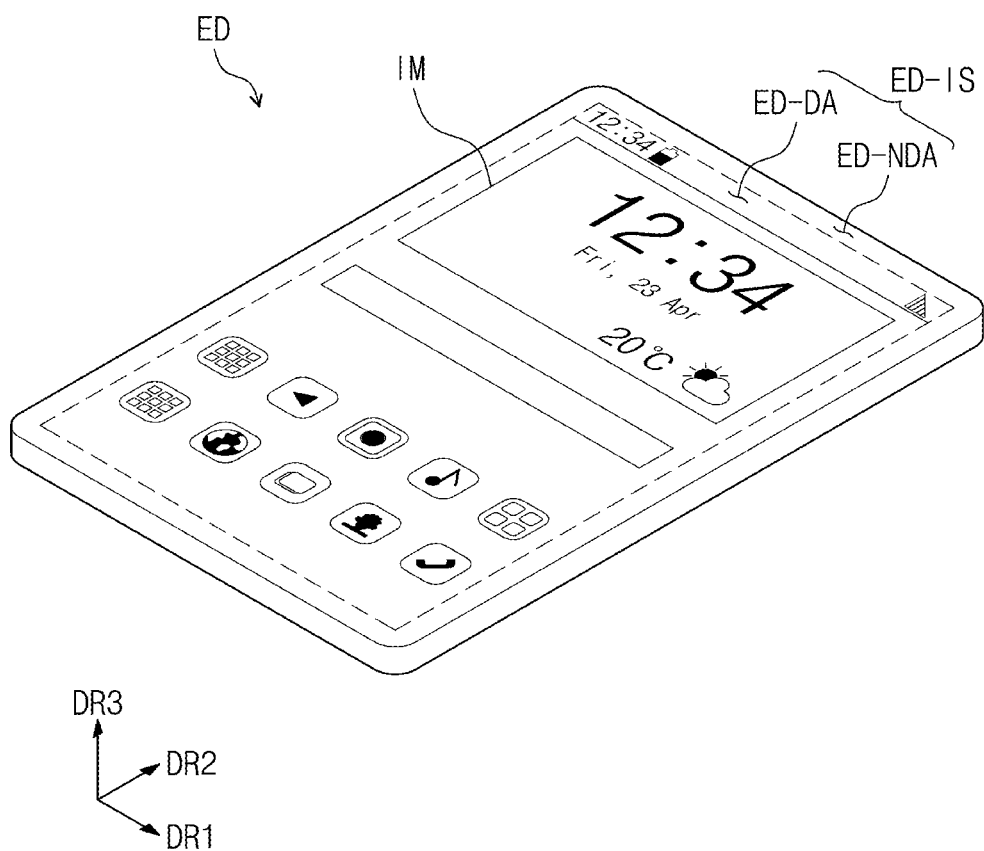
FIG. 1 is a perspective view of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the x, y, and z-axes, and may be interpreted in a broader sense. For example, the DR1-axis, the DR2-axis, and the DR3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device and a method of manufacturing the display device according to an embodiment will be described.

Figure 2:
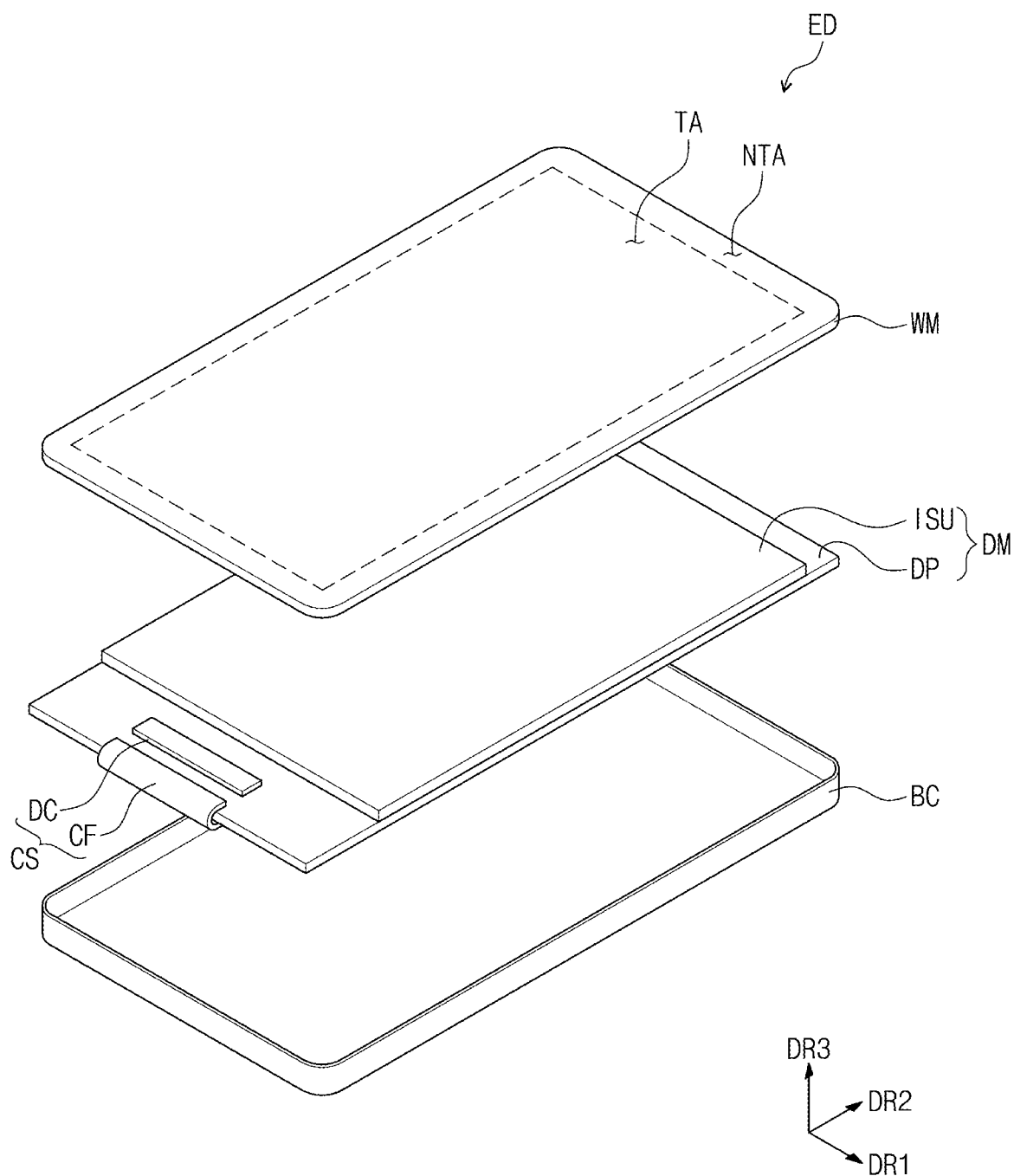
FIG. 2 is an exploded perspective view of the display device of FIG. 1.

FIG. 1 is a perspective view of a display device according to an embodiment. FIG. 2 is an exploded perspective view of a display device according to an embodiment.

In the descriptions, a cell phone terminal is exemplarily illustrated as a display device ED. The display device ED may be applicable to large-sized electronic devices such as televisions and monitors, and also to small-and-medium-sized electronic devices such as tablet computers, car navigation systems, game consoles, smart watches, and the like.

Referring to FIG. 1, the display device ED may display an image IM through a display surface ED-IS. As an example of the image IM, icon images are illustrated. The display surface ED-IS is parallel to a plane defined by a first direction axis DR1 and a second direction axis DR2. The normal direction of the display surface ED-IS, e.g., the thickness direction of the display device ED is indicated by a third direction axis DR3.

The display surface ED-IS may include a display region ED-DA on which the image IM is displayed and a non-display region ED-NDA adjacent to the display region ED-DA. The non-display area ED-NDA is an area on which the image IM is not displayed. However, the embodiments are not limited thereto. The non-display area ED-NDA may be adjacent to only one side of the display area ED-DA. Alternatively, the non-display area ED-NDA may be omitted.

In the descriptions, "when viewed on a plane," "on a plane" or "in a plan view" may mean when viewed from the direction DR3. A front surface (e.g., an upper surface) and a back surface (e.g., a lower surface) of each layer or unit described below are distinguished by the third direction DR3. However, the combination of the first, second, and third directions DR1, DR2, and DR3 may be changed to another combination.

Referring to FIG. 2, the display device ED may include a window WM, a display module DM, and a housing member BC. For example, the display device ED may further include an optical member disposed between the window WM and the display module DM. The optical member may include a polarizer.

The window WM may be disposed above the display module DM, and may transmit an image provided from the display module DM to the outside. The window WM may include a transmission region TA and a non-transmission region NTA. The transmission region TA may overlap the display region ED-DA, and may have a shape corresponding to the display region ED-DA. The window WM may include a base layer and functional layers disposed on the base layer. The functional layers may include a protection layer, anti-fingerprint layer, and the like. The base layer of the window WM may be composed of glass, sapphire, plastic, or the like.

The non-transmission region NTA may overlap the non-display region ED-NDA. For example, the non-transmission region NTA may have a shape corresponding to the non-display region ED-NDA. The non-transmission region NTA may be a region having a relatively lower light transmittance than the transmission region TA. The non-transmission region NTA may be defined by disposing a bezel pattern on a portion of the base layer of the window WM, and a region in which the bezel pattern is not disposed may be defined as a transmission region TA. However, the embodiments are not limited thereto. For example, the non-transmission region NTA may be omitted.

According to an embodiment, the display panel DP may be any one among a liquid crystal display panel, an electrophoretic display panel, a microelectromechanical system (MEMS) display panel, an electrowetting display panel, an organic light emitting display panel, an inorganic light emitting display panel, and a quantum dot light emitting display panel. However, embodiments are not limited thereto. Hereinafter, the display panel DP will be described as an organic light emitting display panel.

An input sensor ISU may include any one among a capacitive sensor, an optical sensor, an ultrasonic sensor, and an electromagnetic induction sensor. The input sensor ISU may be formed on the display panel DP through a continuous process, or may be separately manufactured, and then fixed on an upper side of the display panel DP through an adhesive layer.

However, embodiments are not limited thereto.

The display device ED may include a circuit board CS. The circuit board CS is electrically connected to the display panel DP. The circuit board CS may include a driving chip DC and a flexible circuit board CF. FIG. 2 illustrates an embodiment in which the driving chip DC is mounted on the display panel DP, but embodiments are not limited thereto. On the basis of a control signal received from the flexible circuit board CF, the driving chip DC may generate a driving signal required for the operation of the display panel DP. The flexible circuit board CF electrically bonded to the display panel DP may be bent and disposed on a rear surface of the display panel DP. Hereinafter, the display device ED will be described with a focus on the display panel DP and the bonding structure of the driving chip DC mounted on the display panel DP.

The housing member BC may accommodate the display module DM, and may be coupled to the window WM. The flexible circuit board CF may be disposed on one end of a base substrate SUB, and may be electrically connected to a circuit element layer DP-CL. For example, the display device ED may further include a main board, electronic modules mounted on the main board, a camera module, a power module, and the like.

For example, the display panel DP according to an embodiment may be divided into a bending portion and a planar portion. The bending portion may be defined as a region of the display panel DP which is bonded to the flexible circuit board CF and bent in a direction toward the rear surface of the display panel DP, and regions other than the region may be defined as the planar portion. According to an embodiment, the bending portion may have a shape in which the width thereof in the second direction DR2 decrease as the distance from the planar portion increases. Accordingly, the planar portion of the display panel DP and the bending portion thereof may have different widths in the second direction DR2.

In the above, a cell phone terminal has been described as the display device ED. However, in the descriptions, it is sufficient when the display device ED includes two or more electrically bonded electronic components. Each of the display panel DP and the driving chip DC mounted on the display panel DP corresponds to a different electronic component, and the display device ED may be configured only with these only, and is not limited to any one embodiment. For example, the display device ED may be configured only with the display panel DP and the flexible circuit board CF connected to the display panel DP, and the display device ED may be configured only with a main board and an electronic module mounted on the main board.

Figure 3:
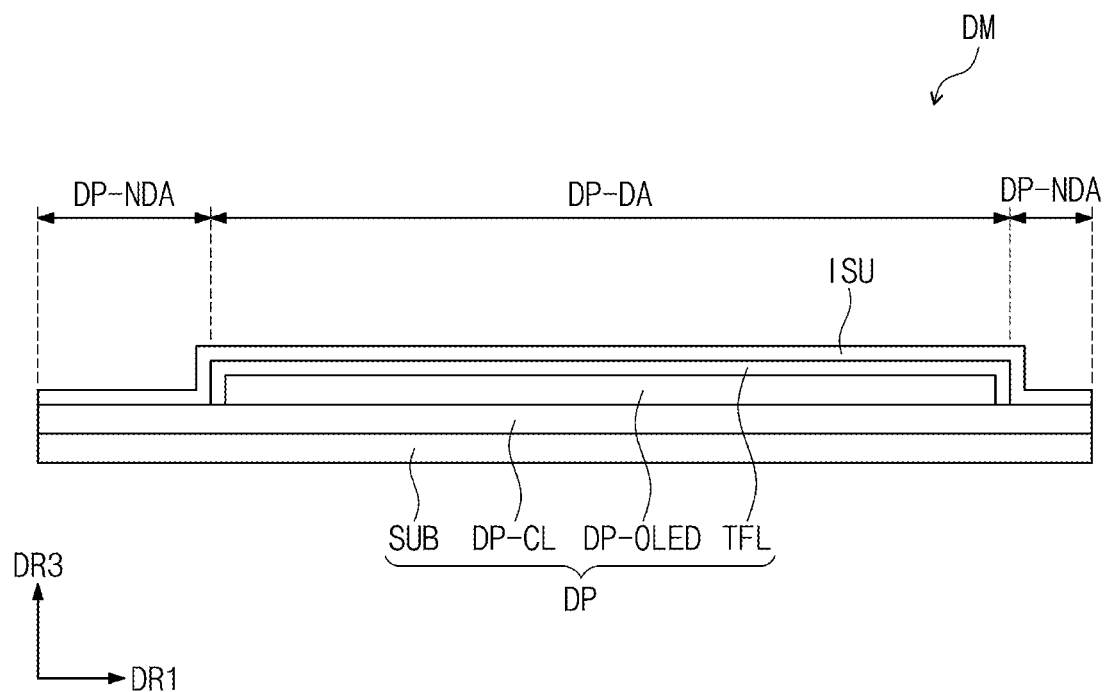
FIG. 3 is a cross-sectional view of a display module of the display device of FIG. 2.
Figure 4:
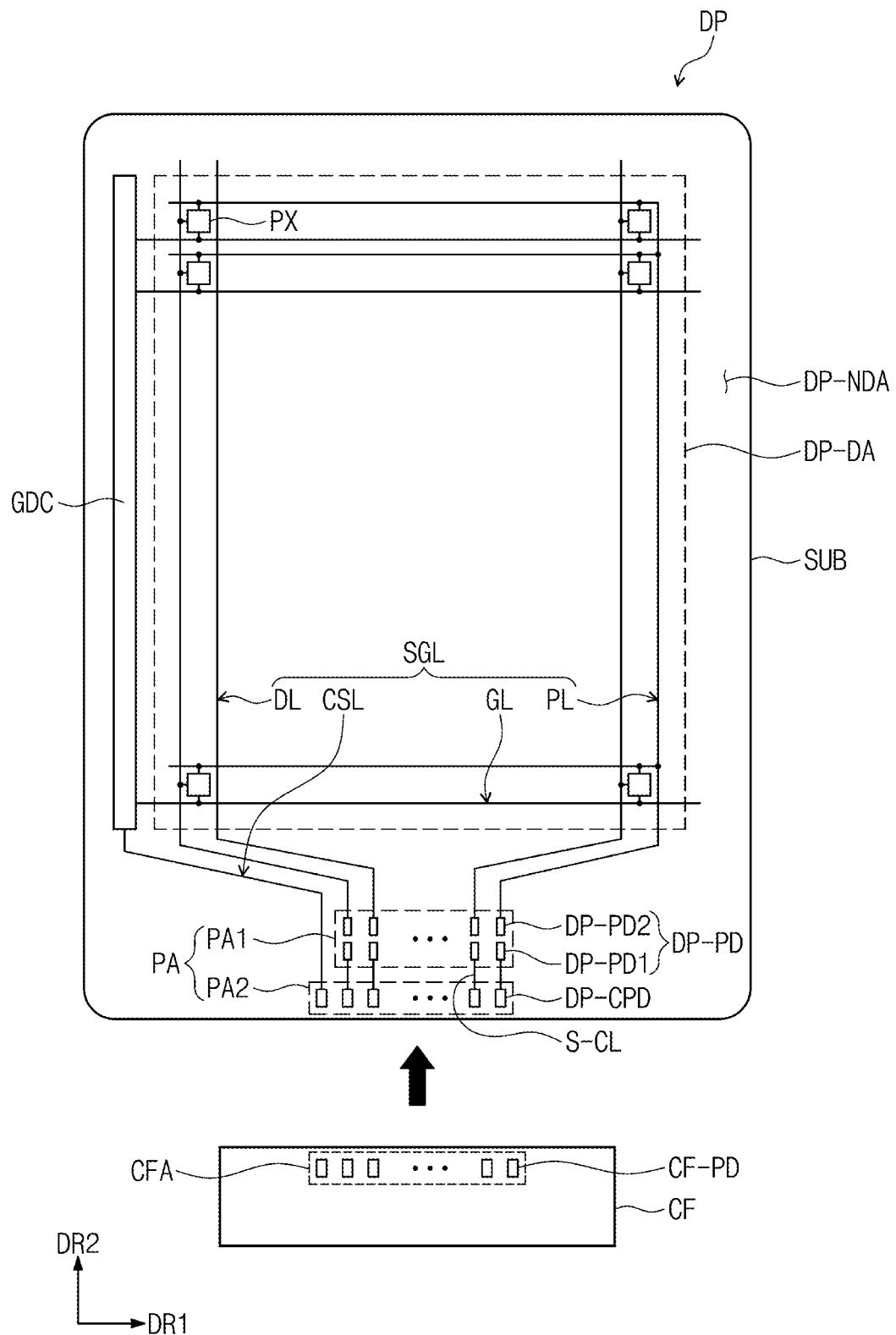
FIG. 4 is a plan view of a display panel of the display device of FIG. 2.
Figure 5:
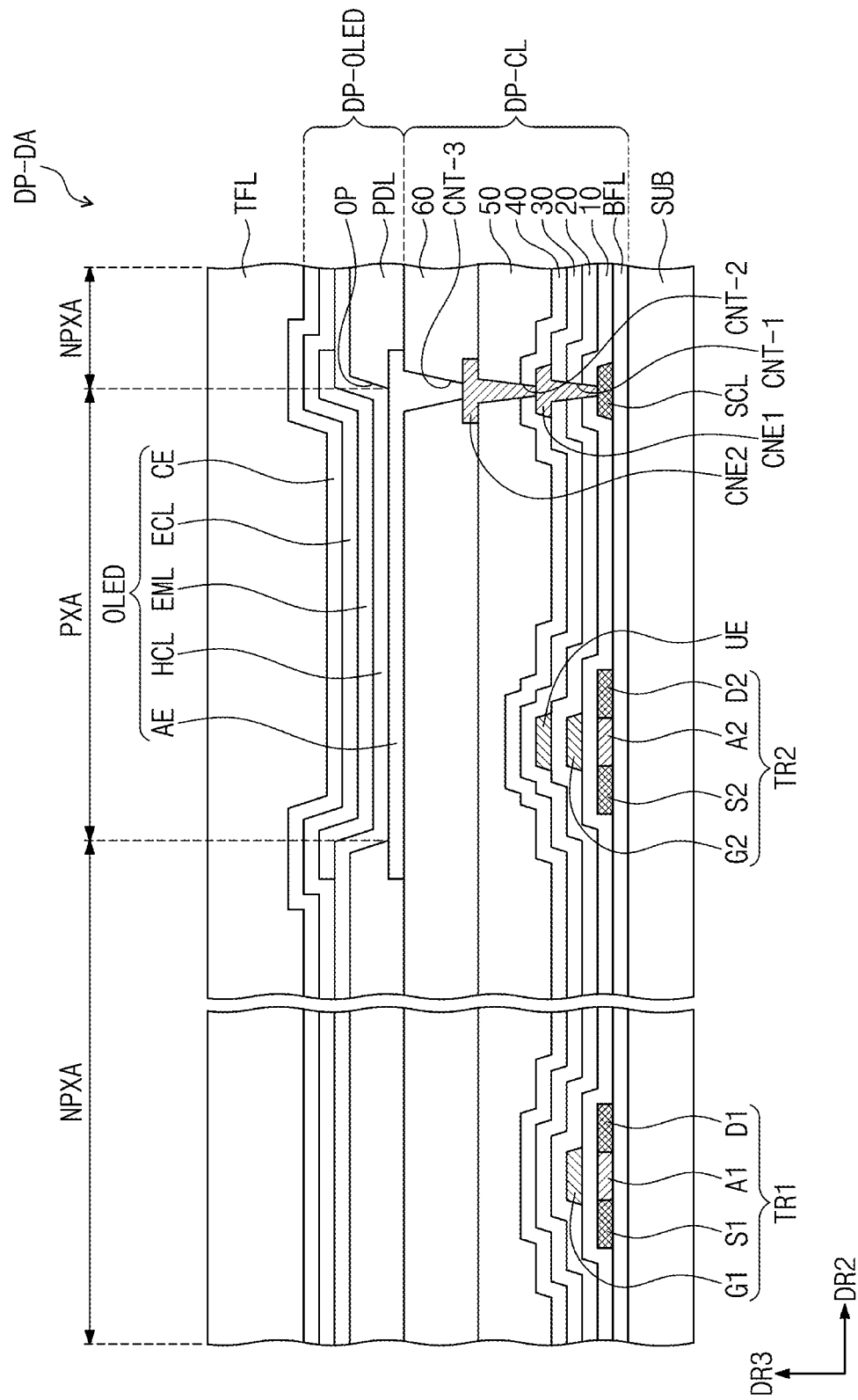
FIG. 5 is a cross-sectional view of a display region of the display panel of the display device of FIG. 2.
Figure 6:
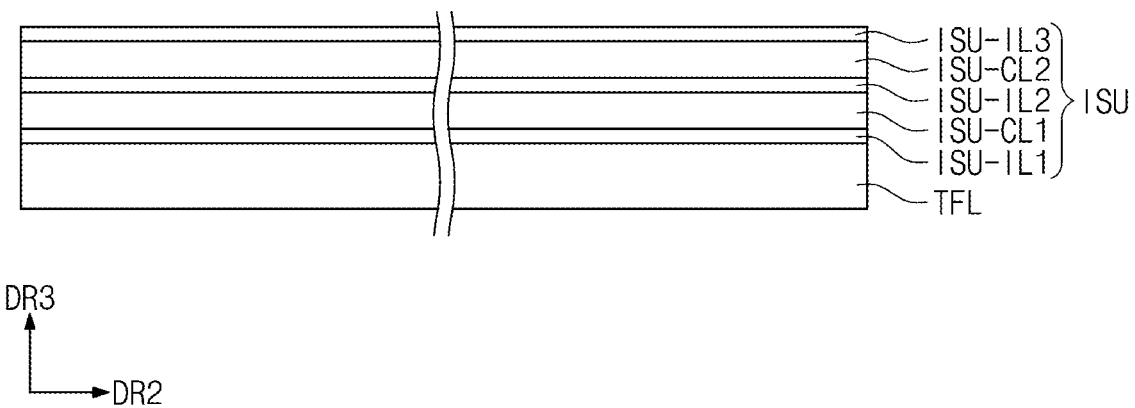
FIG. 6 is a cross-sectional view of an input sensor of the display module of the display device of FIG. 2.

FIG. 3 is a cross-sectional view of the display module DM according to an embodiment. FIG. 4 is a plan view of the display panel DP according to an embodiment. FIG. 5 is a cross-sectional view of the display panel DP according to an embodiment. FIG. 6 is a plan view of the input sensor ISU according to an embodiment.

Referring to FIG. 3, the display panel DP may include the base substrate SUB, the circuit element layer DP-CL disposed on the base substrate SUB, a display element layer DP-OLED, and an upper insulation layer TFL. The input sensor ISU may be disposed on the upper insulation layer TFL.

The display panel DP may include a display region DP-DA and a non-display region DP-NDA. The display region DP-DA of the display panel DP may correspond to the display region ED-DA illustrated in FIG. 2 or the transmission region TA illustrated in FIG. 2, and the non-display region DP-NDA may correspond to the non-display region ED-NDA illustrated in FIG. 1 or the non-transmission region NTA illustrated in FIG. 2.

The base substrate SUB may include at least one plastic film. The base substrate SUB is a flexible substrate, and may include a plastic substrate, a glass substrate, a metal substrate, or an organic/inorganic composite material substrate.

The circuit element layer DP-CL may include at least one intermediate insulation layer and a circuit element. The intermediate insulation layer may include at least one intermediate inorganic layer and at least one intermediate organic layer. The circuit element may include signal lines, a driving circuit of a pixel, and the like.

The display element layer DP-OLED may include a plurality of organic light emitting diodes. The display element layer DP-OLED may further include an organic layer such as a pixel definition film. The upper insulation layer TFL seals or encapsulates the display element layer DP-OLED. As an example, the upper insulation layer TFL may include a thin film encapsulation layer. The thin film encapsulation layer may include a laminate structure of an inorganic layer/organic layer/inorganic layer. The upper insulation layer TFL protects the display element layer DP-OLED from foreign substances such as moisture, oxygen, and dust particles. However, embodiments are not limited thereto. The upper insulation layer TFL may further include an additional insulation layer in addition to the thin film encapsulation layer. For example, an optical insulation layer for controlling a refractive index may be further included.

In an embodiment, an encapsulation substrate may be provided instead of the upper insulation layer TFL. In this case, the encapsulation substrate opposes the base substrate SUB, and the circuit element layer DP-CL and the display element layer DP-OLED may be disposed between the encapsulation substrate and the base substrate SUB.

The input sensor ISU may be directly disposed on the display panel DP. As used herein, "Component A is directly disposed on Component B" means that no adhesive layer is disposed between Component A and Component B. In the descriptions, the input sensor ISU may be manufactured in a continuous process with the display panel DP. However, embodiments are not limited thereto. The input sensor ISU may be provided as an individual panel, and coupled to the display panel DP through an adhesive layer. As another example, the input sensor ISU may be omitted.

Referring to FIG. 4, the display panel DP may include a plurality of pixels PX, a gate driving circuit GDC, a plurality of signal lines SGL, and a plurality of display pads DP-PD and DP-CPD.

The pixels PX may be disposed in the display region DP-DA. Each of the pixels PX may include an organic light emitting diode and a pixel driving circuit connected thereto. The gate driving circuit GDC and the signal lines SGL may be included in the circuit element layer DP-CL illustrated in FIG. 2.

The gate driving circuit GDC may sequentially output gate signals to a plurality of gate lines GL. The gate driving circuit GDC may include a plurality of thin film transistor formed through the same process, by which the driving circuits of the pixels PX is formed. For example, the process may include a Low Temperature Polycrystalline Silicon (LTPS) process or a Low Temperature Polycrystalline Oxide (LTPO) process. The display panel DP may further include another driving circuit for providing a light emission control signal to the pixels PX.

The signal lines SGL may include the gate lines GL, data lines DL, a power line PL, and a control signal line CSL. The gate lines GL may be each connected to a corresponding pixel PX among the pixels PX, and the data lines DL may be each connected to a corresponding pixel PX among the pixels PX. The power line PL may be connected to the pixels PX. The control signal line CSL may provide control signals to a scan driving circuit.

The signal lines SGL may overlap the display region DP-DA and the non-display region DP-NDA. The signal lines SGL may each include a pad unit and a line unit. The line unit may overlap the display region DP-DA and the non-display region DP-NDA. The pad unit may be connected to an end of the line unit. The pad unit may overlap a pad region to be described later. The display panel DP may include a pad region PA disposed in the non-display region DP-NDA. The pad region PA may include a first pad region PA1 and a second pad region PA2.

The display panel DP may include the plurality of display pads DP-PD and DP-CPD. The plurality of display pads DP-PD and DP-CPD may include a plurality of first display pads DP-PD and a plurality of second display pads DP-CPD. A region, in which the plurality of first display pads DP-PD are disposed, is defined as the first pad region PA1, and a region, in which the plurality of second display pads DP-CDP are disposed, is defined as the second pad region PA2. On the first pad region PA1, the driving chip DC (see FIG. 2) may be mounted. The plurality of first display pads DP-PD may be electrically connected to the driving chip DC, and transmit an electrical signal received from the driving chip DC to the signal lines SGL.

The plurality of first display pads DP-PD may include a plurality of first pads DP-PD1 arranged along the first direction DR1 and a plurality of second pads DP-PD2 spaced apart from the plurality of first pads DP-PD1 in the second direction DR2 and arranged along the first direction DR1. FIG. 4 exemplarily illustrates two pad rows in the first pad region PA1, but embodiments are not limited thereto. The plurality of first display pads DP-PD may be arranged in one row along the first direction DR1, or arranged in 3 or more pad rows.

In the second pad region PA2, the plurality of second display pads DP-CPD may be disposed. The plurality of second display pads DP-CPD may be arranged along the first direction DR1. The plurality of first display pads DP-PD and the plurality of second display pads DP-CPD may be connected through bridge signal lines S-CL.

The plurality of second display pads DP-CPD may also include pad rows arranged along the first direction DR1 as the plurality of first display pads DP-PD. One pad row may include the plurality of second display pads DP-CPD arranged spaced apart in the second direction DR2. The plurality of second display pads DP-CPD included in different pad rows may have an arrangement form of overlapping each other or being spaced apart from each other when viewed in the second direction DR2, but embodiments are not limited thereto.

The flexible circuit board CF may include a plurality of circuit pads CF-PD electrically connected to the display panel DP. The plurality of circuit pads CF-PD may be disposed in a circuit pad region CFA defined on the flexible circuit board CF. The plurality of circuit pads CF-PD may be arranged along the first direction DR1.

In addition, when the plurality of second display pads DP-CPD are arranged in the form of pad rows arranged in the first direction DR1, the plurality of circuit pads CF-PD included in the flexible circuit board CF may also have an arrangement form corresponding to the plurality of second display pads DP-CPD in one to one relationship. However, embodiments are not limited thereto.

The circuit pad region CFA of the flexible circuit board CF may be disposed on the plurality of second display pads DP-CPD. The plurality of second display pads DP-CPD may be electrically connected to the plurality of circuit pads CF-PD included in the flexible circuit board CF, and transmit an electrical signal received from the flexible circuit board CF to the plurality of first display pads DP-PD. The flexible circuit board CF may be rigid or flexible. For example, when the flexible circuit board CF is flexible, it may be provided as a flexible printed circuit board.

The flexible circuit board CF may include a timing control circuit which controls the operation of the display panel DP. The timing control circuit may be mounted on the flexible circuit board CF in the form of an integrated chip. In addition, For example, the flexible circuit board CF may include an input sensing circuit which controls the input sensor ISU.

For example, the display panel DP is described as having a structure in which the plurality of first display pads DP-PD for mounting the driving chip DC illustrated in FIG. 2 are included, but embodiments are not limited thereto. The driving chip DC may be mounted on the flexible circuit board CF, in which case the plurality of first display pads DP-PD may be omitted.

At least one of a plurality of recessed patterns to be described later may overlap the pad region PA of the display panel DP. The plurality of recessed patterns may include patterns recessed from a lower surface of the base substrate SUB of the display panel DP with a predetermined thickness. The plurality of recessed patterns will be described in detail later.

FIG. 5 is a cross-sectional view of a display panel according to an embodiment. FIG. 6 is a cross-sectional view of an input sensor according to an embodiment.

Referring to FIG. 5, the display region DP-DA may include a light emitting region PXA and a non-light emitting region NPXA. Each of the pixels PX may include an organic light emitting diode OLED and a pixel driving circuit connected thereto. In detail, the pixel PX may include a first transistor TR1, a second transistor TR2, and the organic light emitting diode OLED. Some transistors TR1 and TR2 of the pixel driving circuit are illustrated.

The display panel DP may include a plurality of insulation layers and semiconductor patterns, a conductive pattern, a signal line, the like. An insulation layer, a semiconductor layer, and a conductive layer may be formed by coating, deposition, and the like. Thereafter, the insulation layer, the semiconductor layer, and the conductive layer may be selectively patterned by photolithography. The semiconductor pattern, the conductive pattern, the signal line, and the like included in the circuit element layer DP-CL and the display element layer DP-OLED may be formed in the above manner.

The base substrate SUB may include a synthetic resin film. The base substrate SUB may have a multi-layered structure. For example, the base substrate SUB may have a three-layered structure of a synthetic resin layer, an inorganic layer, and a synthetic resin layer. Particularly, the synthetic resin layer may be a polyimide-based resin layer. However, embodiments are not limited thereto. In addition, the base substrate SUB may include a glass substrate, a metal substrate, an organic/inorganic composite material substrate, or the like.

At least one inorganic layer may be disposed on an upper surface of the base substrate SUB. The inorganic layer may be formed as a multi-layered inorganic layer. The multi-layered inorganic layers may constitute a barrier layer and/or a buffer layer. In an embodiment, referring to FIG. 5, the display panel DP may include a buffer layer BFL.

The semiconductor pattern may be disposed on the buffer layer BFL. The semiconductor pattern may include polysilicon. However, embodiments are not limited thereto, and the semiconductor pattern may include amorphous silicon or a metal oxide.

FIG. 5 only illustrates a portion of the semiconductor pattern, and the semiconductor pattern may be further disposed in another region of the pixel PX on a plane. The semiconductor pattern may be arranged according to specific patterns in the display panel DP. The semiconductor pattern has different electrical properties according to whether the semiconductor pattern is doped or not. The semiconductor pattern may include a first region and a second region. The first region may be doped with an N-type dopant or a P-type dopant. A P-type transistor may include a doped region doped with the P-type dopant.

The first region may have greater conductivity than the second region, and may substantially serve as an electrode or a signal line. The second region may have a low doping concentration, or may be a non-doped region, and substantially corresponds to an active region (e.g., channel) of a transistor. In other words, a portion of the semiconductor pattern may be an active region of a transistor, another portion thereof may be a source or a drain of the transistor, and the other portion thereof may be a connection electrode or a connection signal line.

As illustrated in FIG. 5, a source S1, an active region A1, and a drain D1 of the first transistor TR1 may be formed from the semiconductor pattern. For example, a source S2, an active region A2, and a drain D2 of the second transistor TR2 may be formed from the semiconductor pattern.

FIG. 5 illustrates a portion of a connection signal line SCL formed from the semiconductor pattern. For example, the connection signal line SCL may be electrically connected to the drain D2 of the transistor TR2 on a plane. Another transistor may be disposed between the connection signal line SCL and the drain D2 of the second transistor TR2.

A first insulation layer 10 may be disposed on the buffer layer BFL. The first insulation layer 10 may commonly overlap the plurality of the pixels PX, and cover the semiconductor pattern. Gates G1 and G2 may be disposed on the first insulation layer 10. The gates G1 and G2 may be a portion of a metal pattern. The gates G1 and G2 may overlap the active regions A1 and A2. In a doping process for the semiconductor pattern, the gates G1 and G2 may be used as masks.

A second insulation layer 20 for covering the gates G1 and G2 may be disposed on the first insulation layer 10. The second insulation layer 20 may commonly overlap the pixels PX. An upper electrode UE may be disposed on the second insulation layer 20. The upper electrode UE may overlap a gate G2 of the second transistor TR2. The upper electrode UE may be a part of a metal pattern. A portion of the gate G2 and the upper electrode UE overlapping the portion of the gate G2 may form a capacitor.

A third insulation layer 30 for covering the upper electrode UE may be disposed on the second insulation layer 20. A first connection electrode CNE1 disposed on the third insulation layer 30 may be connected to the connection signal line SCL through a contact hole CNT-1 penetrating the first, second, and third insulation layers 10, 20, and 30.

A fourth insulation layer 40 for covering the first connection electrode CNE1 may be disposed on the third insulation layer 30. The first insulation layer 10 and the fourth insulation layer 40 may each be an inorganic layer and/or an organic layer, and may each have a single-layered structure or a multi-layered structure.

A fifth insulation layer 50 may be disposed on the fourth insulation layer 40. The fifth insulation layer 50 may be an organic layer. A second connection electrode CNE2 may be disposed on the fifth insulation layer 50. The second connection electrode CNE2 may be connected to the first connection electrode CNE1 through a contact hole CNT-2 penetrating the fourth insulation layer 40 and the fifth insulation layer 50.

A sixth insulation layer 60 for covering the second connection electrode CNE2 may be disposed on the fifth insulation layer 50. The sixth insulation layer 60 may be an organic layer. A first electrode AE may be disposed on the sixth insulation layer 60. The first electrode AE is connected to the second connection electrode CNE2 through a contact hole CNT-3 penetrating the sixth insulation layer 60.

An opening OP is defined by a pixel definition film PDL. The opening OP of the pixel definition film PDL may expose at least a portion of the first electrode AE. In an embodiment, the light emitting region PXA is defined to correspond to the portion of the first electrode AE exposed by the opening OP.

A hole control layer HCL may be commonly disposed in the light emitting region PXA and the non-light emitting region NPXA. The hole control layer HCL may include a hole transport layer, and may further include a hole injection layer. A light emitting layer EML may be disposed on the hole control layer HCL. The light emitting layer EML may be disposed in a region corresponding to the opening OP. For example, the light emitting layer EML may be separately formed on each of the pixels.

An electron control layer ECL may be disposed on the light emitting layer EML. The electron control layer ECL may include an electron transport layer, and may further include an electron injection layer. The hole control layer HCL and the electron control layer ECL may be commonly formed in the plurality of pixels PX by using an open mask. A second electrode CE may be disposed on the electron control layer ECL. The second electrode CE may have an integral shape, and may be commonly disposed in the plurality of pixels PX. The upper insulation layer TFL may be disposed on the second electrode CE. The upper insulation layer TFL may include a plurality of thin films.

As illustrated in FIG. 6, the input sensor ISU may be directly disposed on the upper insulation layer TFL. The input sensor ISU may include a first sensing insulation layer ISU-IL1, a first conductive layer ISU-CL1, a second sensing insulation layer ISU-IL2, a second conductive layer ISU-CL2, and a third sensing insulation layer ISU-IL3. The first sensing insulation layer ISU-IL1 may be directly disposed on the upper insulation layer TFL. In an embodiment, the first sensing insulation layer ISU-IL1 may be omitted.

Each of the first conductive layer ISU-CL1 and the second conductive layer ISU-CL2 may have a single-layered structure, or a multi-layered structure in which layers are laminated along the third direction DR3. A conductive layer of a multi-layered structure may include at least two layers of transparent conductive layers and metal layers. The conductive layer of a multi-layered structure may include metal layers including different metals.

The transparent conductive layer may include indium tin oxide (ITO), indium zinc oxide (IZO), zinc oxide (ZnO), indium tin zinc oxide (ITZO), PEDOT, metal nanowires, and graphene. The metal layer may include molybdenum, silver, titanium, copper, aluminum, or an alloy thereof.

For example, at least any one of the first conductive layer ISU-CL1 and the second conductive layer ISU-CL2 may have a three-layered metal layer structure, such as a three-layered structure of titanium/aluminum/titanium. A metal having relatively high durability and low reflectance may be applied to an outer layer, and a metal having high electrical conductivity may be applied to an inner layer.

Each of the first conductive layer ISU-CL1 and the second conductive layer ISU-CL2 may include a plurality of conductive patterns. Hereinafter, the first conductive layer ISU-CL1 is described as including first conductive patterns, and the second conductive layer ISU-CL2 is described as including second conductive patterns. Each of the first conductive patterns and the second conductive patterns may include sensing electrodes and signal lines connected thereto. The sensing electrodes of the first conductive patterns and the sensing electrodes of the second conductive patterns may cross each other while being insulated from each other.

In addition, in the input sensor ISU according to an embodiment, any one of the first conductive layer ISU-CL1 and the second conductive layer ISU-CL2 may be omitted, and only a single-layered conductive layer may be included. However, embodiments are not limited thereto.

Each of the first sensing insulation layer ISU-IL1, the second conductive layer ISU-CL2, and the third sensing insulation layer ISU-IL3 may include an inorganic layer or an organic layer. In an embodiment, the first sensing insulation layer ISU-IL1 and the second sensing insulation layer ISU-IL2 may each be an inorganic layer. The third sensing insulation layer ISU-IL3 may include an organic layer.

In addition, in the input sensor ISU, any one among the first sensing insulation layer ISU-IL1, the second insulation layer ISU-IL2, and the third sensing insulation layer ISU-IL3 may be omitted, but embodiments are not limited thereto.

Figure 7:
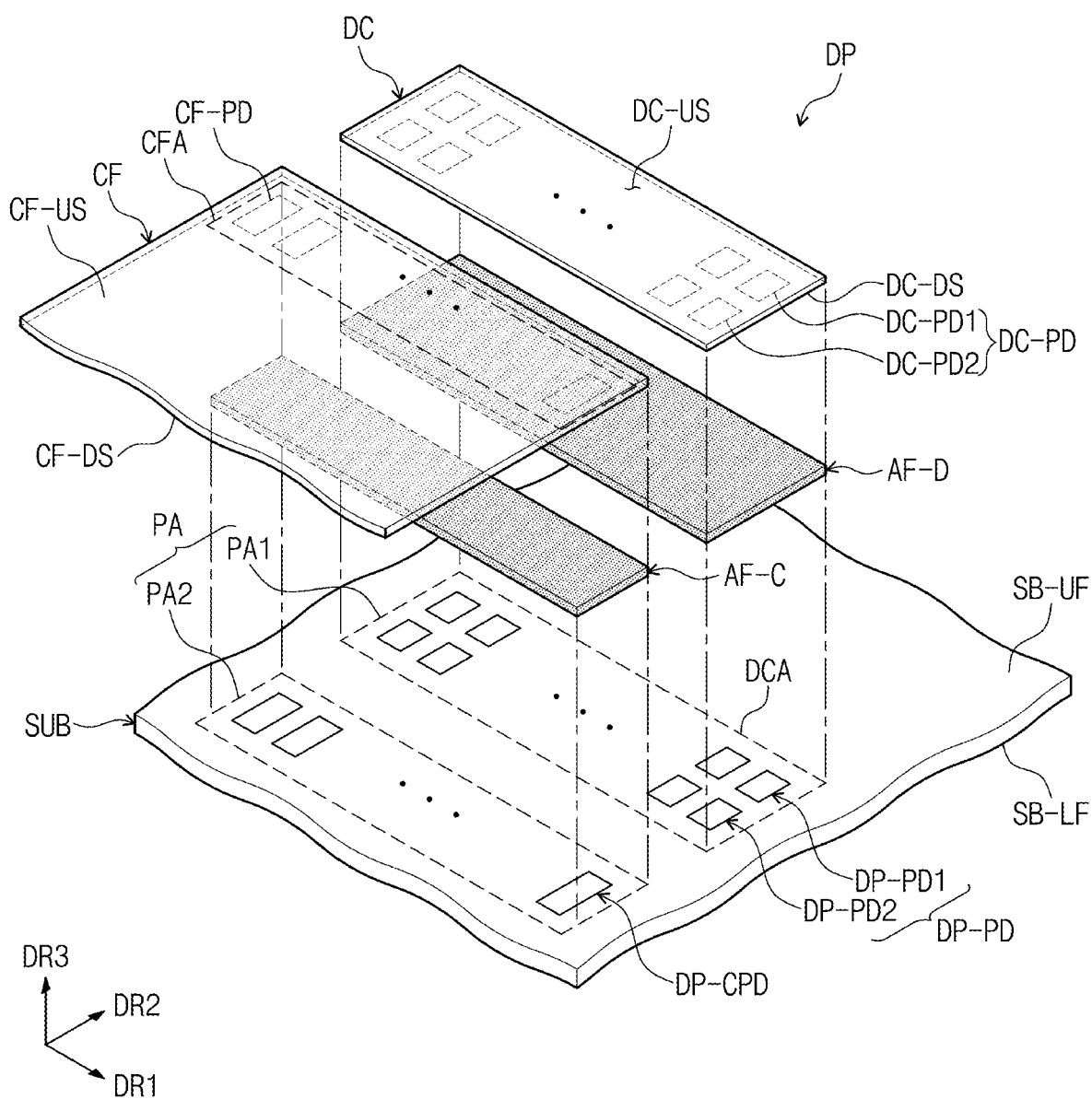
FIG. 7 is an exploded perspective view illustrating a connection between a circuit board and a display panel of the display device of FIG. 2.
Figure 8:
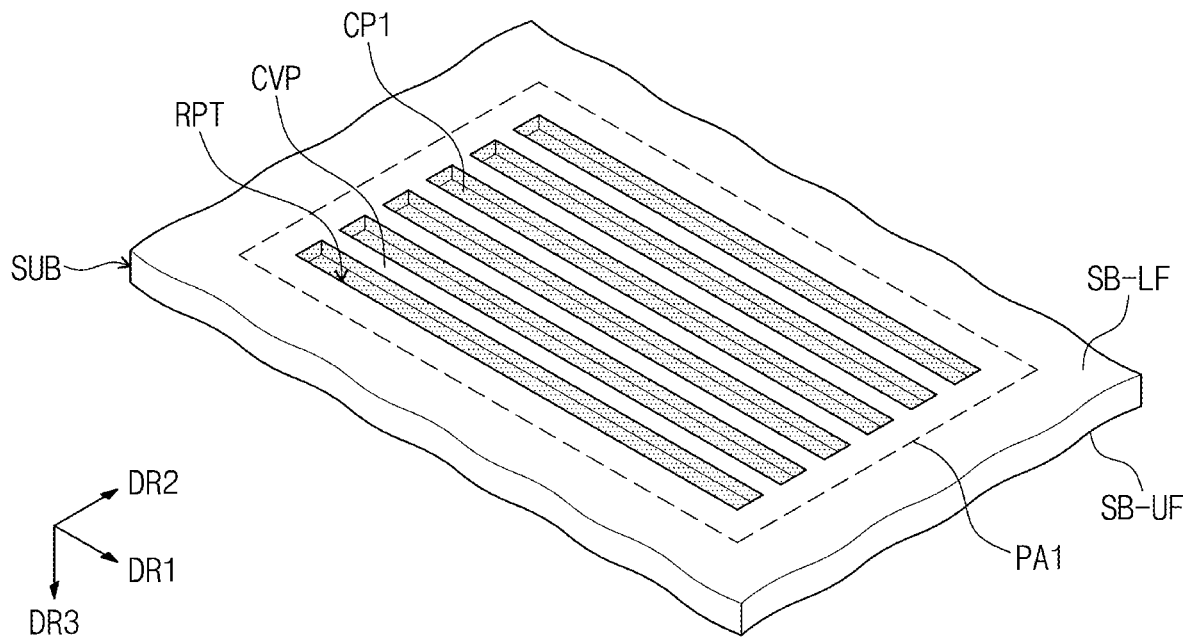
FIG. 8 is a perspective view of a base substrate of the display panel of FIG. 7.
Figure 9:
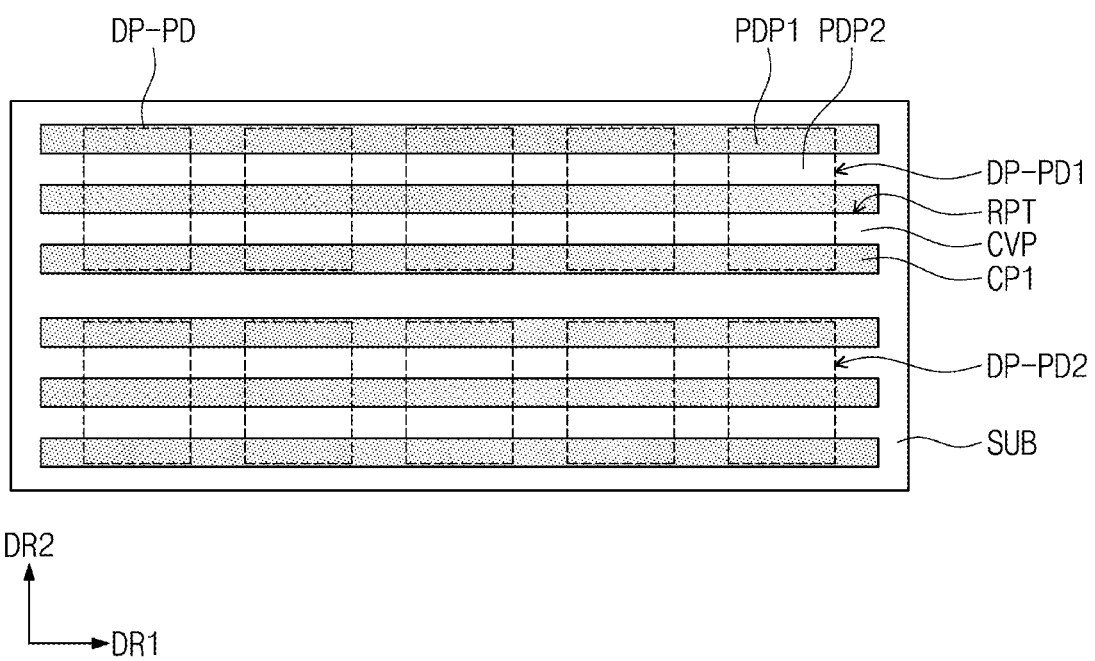
FIG. 9 is a plan view illustrating display pads of the display panel of FIG. 7.

FIG. 7 is an exploded perspective view showing a portion of a display device according to an embodiment. FIG. 8 is a perspective view of a base substrate according to an embodiment. FIG. 9 is a plan view of a display panel according to an embodiment. In FIGS. 8 and 9, a portion corresponding to the first pad region PA1 in the display panel DP is enlarged and illustrated.

Referring to FIGS. 7, 8, and 9, the display panel DP may include the base substrate SUB and the plurality of display pads DP-PD and DP-CPD disposed on the base substrate SUB. The base substrate SUB may include an upper surface SB-UF and a lower surface SB-LF opposing the upper surface SB-UF. The plurality of display pads DP-PD and DP-CPD may be disposed on the upper surface SB-UF of the base substrate SUB. The plurality of first display pads DP-PD may include the plurality of first pads DP-PD1 and the plurality of second pads DP-PD2. However, embodiments are not limited thereto. The plurality of first display pads DP-PD may be arranges in three or more rows.

A plurality of recessed patterns RPT may be defined on the lower surface SB-LF of the base substrate SUB. At least one of the plurality of recessed patterns RPT defined on the lower surface SB-LF of the base substrate SUB may overlap the pad region PA in which the plurality of display pads DP-PD and DP-CPD are disposed on a plane. For example, at least one of the plurality of recessed patterns RPT may overlap the first pad region PA1 in which the plurality of first display pads DP-PD are disposed, or may overlap the second pad region PA2 in which the plurality of second display pads DP-CPD are disposed. In addition, at least one of the plurality of recessed patterns RPT may overlap both the first pad region PA1 and the second pad region PA2. FIGS. 8 and 9 exemplarily illustrate that the plurality of recessed patterns RPT overlap the first pad region PA1 of the pad region PA in which the plurality of first display pads DP-PD are disposed.

Referring to FIGS. 8 and 9, each of the plurality of recessed patterns RPT may be recessed from the lower surface SB-LF of the base substrate SUB to a predetermined thickness or a predetermined depth, and may extend in the first direction DR1. The plurality of recessed patterns RPT may be spaced apart from each other in the second direction DR2. FIGS. 8 and 9 illustrate that six recessed patterns RPT are defined on the lower surface SB-LF of the base substrate SUB in the first pad region PA1, but this is only exemplary. Embodiments are not limited thereto.

The plurality of recessed patterns RPT may be disposed according to a predetermined pattern in which the plurality of first display pads DP-PD are disposed. The plurality of the recessed patterns RPT may be arranged at a predetermined interval along the second direction DR2. For example, the intervals between two adjacent recessed patterns RPT may be the same as each other in the second direction DR2. However, embodiments are not limited thereto. The intervals between the plurality of recessed patterns RPT may be different from each other, or may be divided into a plurality of groups according to pad rows. For example, the plurality of recessed patterns RPT may be divided into a first group overlapping the plurality of first pads DP-PD1 and a second group overlapping the plurality of second pads DP-PD2. In this case, the plurality of recessed patterns RPT may not overlap a non-pad region disposed between the plurality of first pads DP-PD1 and the plurality of second pads DP-PD2.

The base substrate SUB may include a plurality of convex patterns CVP. The plurality of convex patterns CVP may be a portion formed between the plurality of recessed patterns RPT. The plurality of convex patterns CVP may be spaced apart from each other in the second direction DR2, and may extend in the first direction DR1. The height of the plurality of convex patterns CVP may substantially be the same as the depth of the plurality of recessed patterns RPT.

At least a portion of each of the plurality of convex patterns CVP may overlap the plurality of display pads DP-PD and DP-CPD on a plane. For example, at least a portion of each of the plurality of convex patterns CVP may overlap the plurality of first display pads DP-PD. Accordingly, each of the plurality of first display pads DP-PD may include a first pad portion PDP1 overlapping the plurality of recessed patterns RPT, and a second pad portion PDP2 not overlapping the plurality of recessed patterns RPT but overlapping the plurality of convex patterns CVP.

In an embodiment, on a plane, the plurality of recessed patterns RPT are illustrated as having a rectangular shape, but the shape of the plurality of recessed patterns RPT may be variously modified. For example, each of the plurality of recessed patterns RPT may have a rectangular shape having rounded corners.

The display panel DP may further include a first coating pattern portion CP1 filling the plurality of recessed patterns RPT. The first coating pattern portion CP1 may be filled in each of the plurality of recessed patterns RPT.

The driving chip DC may include an upper surface DC-US and a lower surface DC-DS. The lower surface DC-DS of the driving chip DC may be a surface facing the display panel DP. The driving chip DC may include a plurality of bumps DC-PD electrically and respectively connected to the plurality of first display pads DP-PD disposed on the base substrate SUB.

The plurality of bumps DC-PD include a plurality of first bumps DP-PD1 arranged along the first direction DR1 and a plurality of second bumps DC-PD2 spaced apart from the plurality of first bumps DP-PD1 in the second direction DR2 and arranged along the first direction DR1. The plurality of first bumps DP-PD1 and the plurality of second bumps DC-PD2 may be exposed to the outside from the lower surface of the driving chip DC.

FIG. 7 illustrates that the plurality of bumps DC-PD are arranged in two rows. However, the plurality of bumps DC-PD may be arranged in a single row or a plurality of rows on the basis of a structure in which the plurality of first display pads DP-PD are arranged. The plurality of bumps DC-PD and the plurality of first display pads DP-PD may be electrically and respectively connected through a first non-conductive layer AF-D.

The display device may further include a non-conductive layer. The non-conductive layer may include the first non-conductive layer AF-D and a second non-conductive layer AF-C. The first non-conductive layer AF-D may be disposed between the driving chip DC and the base substrate SUB to bond the driving chip DC and the base substrate SUB. The second non-conductive layer AF-C may be disposed between the flexible circuit board CF and the base substrate SUB to bond the flexible circuit board CF and the base substrate SUB. Each of the first non-conductive layer AF-D and the second non-conductive layer AF-C has non-conductive properties, and may be provided as a film-type adhesive resin including a thermal initiator. The hardening properties of the first non-conductive layer AF-D and the second non-conductive layer AF-C may be changed according to external heat.

Since the plurality of first display pads DP-PD and the plurality of bumps DC-PD are covered by the first non-conductive layer AF-D, the plurality of first display pads DP-PD and the plurality of bumps DC-PD may be blocked from external air. As a result, the oxidation of the plurality of first display pads DP-PD and the plurality of bumps DC-PD caused by the external air may be prevented.

The flexible circuit board CF may include an upper surface CF-US and a lower surface CF-DS. The lower surface CF-DS of the flexible circuit board CF may be a surface facing the display panel DP. The plurality of circuit pads CF-PD may be disposed on the lower surface CF-DS of the flexible circuit board CF, and may be electrically and respectively connected to the plurality of second display pads DP-CPD of the display panel DP. The plurality circuit pads CF-PD and the plurality of second display pads DP-CPD may be electrically and respectively connected through the second non-conductive layer AF-C.

Since the plurality of second display pads DP-CPD and the plurality of circuit pads CF-PD are covered by the second non-conductive layer AF-C, the plurality of second display pads DP-CPD and the plurality of circuit pads CF-PD may be blocked from external air. As a result, the oxidation of the plurality of second display pads DP-CPD and the plurality of circuit pads CF-PD caused by the external air may be prevented.

Typically, an anisotropic conductive film has been used as a means to connect a display panel and a circuit board and the like. An anisotropic conductive film is formed by dispersing conductive particles (e.g., conductive balls) in an insulating adhesive, and electrical conduction in a vertical direction may be implemented by the conductive particles trapped between a pad and a bump where bonding occurs. However, such a method has a disadvantage in that an electrical short-circuit may be occurred since horizontal conduction may be generated due to the limit of the size of conductive particles when a pitch, which is a separation distance between adjacent pads, is reduced, and an electrical open-circuit may occur between a bump and a pad when the conductive particles are not uniformly distributed.

The display device according to an embodiment uses a non-conductive layer to directly contact a display panel and a driving chip, thereby solving the electrical short-circuit or open-circuit problem caused by a conductive ball, so that a fine pitch may be formed between adjacent pads. In addition, since a conductive ball is not included, it may be advantageous in terms of process cost, and due to the direct contact method, there is an advantage in that an effective contact area is wide, so that contact resistance decreases.

According to an embodiment, the first non-conductive layer AF-D may be disposed between the plurality of first display pads DP-PD and the plurality of bumps DC-PD before the plurality of first display pads DP-PD and the plurality of bumps DC-PD are in contact. In addition, the second non-conductive layer AF-C may be disposed between the plurality of second display pads DP-CPD and the plurality of circuit pads CF-PD before the plurality of second display pads DP-CPD and the plurality of circuit pads CF-PD are in contact.

The plurality of first display pads DP-PD and the plurality of bumps DC-PD respectively corresponding to the plurality of the plurality of first display pads DP-PD may be thermally compressed to each other. Through a process of thermally compressing the plurality of first display pads DP-PD and the plurality of bumps DC-PD to each other, the first non-conductive layer AF-D between the plurality of first display pads DP-PD and the plurality of bumps DC-PD may be moved to another space. Here, another space may refer to a place between the base substrate SUB and the driving chip DC not overlapping the plurality of first display pads DP-PD and the plurality of bumps DC-PD. For example, another space may refer to a non-pad region between the plurality of first display pads DP-PD or between the first pad region PA1 and the second pad region PA2.

The plurality of second display pads DP-CPD and the plurality of circuit pads CF-PD may be thermally compressed to each other. In the same manner, through a process of thermally compressing the plurality of second display pads DP-CPD and the plurality of circuit pads CF-PD to each other, the second non-conductive layer AF-C between the plurality of second display pads DP-CPD and the plurality of circuit pads CF-PD may be moved to another space.

Each of the first non-conductive layer AF-D and the second non-conductive layer AF-C may be provided in a film type. The first non-conductive layer AF-D may have a predetermined thickness to bond the driving chip DC and the base substrate SUB. The second non-conductive layer AF-C may have a predetermined thickness to bond the flexible circuit board CF and the base substrate SUB.

Each of the first non-conductive layer AF-D and the second non-conductive layer AF-C may include at least one among an acrylic polymer, a silicon-based polymer, a urethane-based polymer, an epoxy-based polymer, and an imide-based polymer. For example, the first non-conductive layer AF-D and the second non-conductive layer AF-C may each independently include any one polymer material selected from an acrylic polymer, a silicon-based polymer, a urethane-based polymer, an epoxy-based polymer, and an imide-based polymer, or a combination of a plurality of selected polymer materials. Each of the first non-conductive layer AF-D and the second non-conductive layer AF-C may be formed from an acrylic resin, a silicon-based resin, a urethane-based resin, an epoxy-based resin, or an imide-based resin. For example, each of the first non-conductive layer AF-D and the second non-conductive layer AF-C may be a portion from by thermosetting or photocuring a base resin such as an acrylic resin, a silicon-based resin, a urethane-based resin, an epoxy-based resin, or an imide-based resin.

For example, after the compression process, the first non-conductive layer AF-D may remain between the plurality of first display pads DP-PD and the plurality of bumps DC-PD, and the second non-conductive layer AF-C may remain between the plurality of second display pads DP-CPD and the plurality of circuit pads CF-PD. For example, due to the first non-conductive layer AF-D remaining between the plurality of first display pads DP-PD and the plurality of bumps DC-PD after the compression process, the effective contact area of the plurality of first display pads DP-PD and the plurality of bumps DC-PD decreases, so that contact resistance of an adhesive portion may increase. In addition, due to the second non-conductive layer AF-C remaining between the plurality of second display pads DP-CPD and the plurality of circuit pads CF-PD after the compression process, the effective contact area of the plurality of second display pads DP-CPD and the plurality of circuit pads CF-PD decreases, so that contact resistance of the adhesive portion may increase. In the descriptions, an "effective contact area" refers to an area of a surface on which a pad and a bump are in direct contact with each other among areas of surfaces on which the pad and the bump oppose each other.

The display device ED according to an embodiment may include the display panel DP including the base substrate SUB on which the plurality of recessed patterns RPT are defined. The plurality of recessed patterns RPT may be recessed from the lower surface SB-LF of the base substrate SUB to a predetermined thickness or a predetermined depth to overlap the pad region PA, and may form a predetermined pattern on the base substrate SUB. Accordingly, in the display device ED according to an embodiment, effective contact areas between the plurality of first display pads DP-PD and the plurality of bumps DC-PD and between the plurality of second display pads DP-CPD and the plurality of circuit pads CF-DP are selectively increased in a region not overlapping the plurality of recessed patterns RPT to reduce contact resistance. Therefore, the connection reliability of the display device may be improved.

Figure 10A:
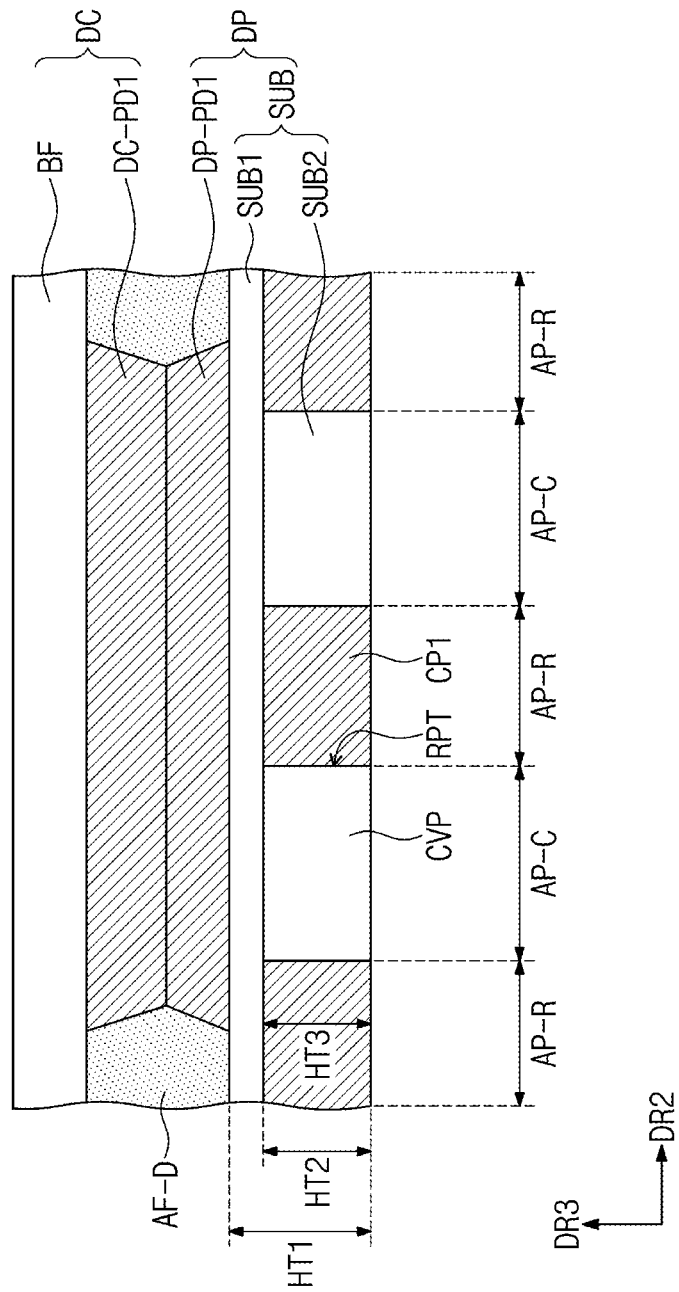
FIG. 10A is a cross-sectional view illustrating a connection between a driving chip and the display pads of FIG. 7.

FIG. 10A is a cross-sectional view showing a portion of a display device according to an embodiment. FIG. 10A illustrates a portion of a cross-section of the first pad region PA1 in a display device according to an embodiment. FIG. 10A exemplarily illustrates a cross-section corresponding to one first pad DP-PD1.

Referring to FIG. 10A, the display panel DP may include the base substrate SUB, the first pad DP-PD1, and a first coating pattern portion CP1. The driving chip DC may include a base layer BF and a first bump DC-PD1 disposed on a lower surface of the base layer BF. The first non-conductive layer AF-D may physically couple the driving chip DC to the display panel DP. The first pad DP-PD1 and the first bump DC-PD1 may be directly connected to each other.

The base substrate SUB may include a first substrate SUB1 and a second substrate SUB2 disposed below the first substrate SUB1. An upper surface of the first substrate SUB1 may correspond to the upper surface SB-UF of the base substrate SUB in FIG. 7. A lower surface of the second substrate SUB2 may correspond to the lower surface SB-LF of the base substrate SUB in FIG. 7.

The first substrate SUB1 and the second substrate SUB2 may each include a flexible material. For example, the first substrate SUB1 and the second substrate SUB2 may each be a plastic substrate. The plastic substrate may include at least one among an acrylic resin, a methacrylic resin, polyisoprene, a vinyl-based resin, an epoxy-based resin, a urethane-based resin, a cellulose-based resin, a siloxane-based resin, a polyimide-based resin, a polyamide-based resin, and a perylene-based resin. In an embodiment, the first substrate SUB1 may include a polyimide-based resin of a single later, and the second substrate SUB2 may include polyethylene terephthalate of a single layer. However, embodiments are not limited thereto. Each of the first substrate SUB1 and the second substrate SUB2 may be a laminated structural body including a plurality of insulation layers, or additional insulation layers may further be included between the first substrate SUB1 and the second substrate SUB2.

The plurality of recessed patterns RPT which are recessed from the lower surface of the base substrate SUB may be formed in the base substrate SUB. A depth HT3 of each of the plurality of recessed patterns RPT defined on the base substrate SUB may be less than a thickness HT1 of the base substrate SUB. In the descriptions, the thickness refers to the length in the third direction DR3. The depth of each of the plurality of recessed patterns RPT represents the length in the third direction DR3 from the lower surface of the base substrate SUB.

In an embodiment, each of the plurality of recessed patterns RPT may be defined recessed to a predetermined thickness or a predetermined depth from the lower surface of the second substrate SUB2. The plurality of recessed patterns RPT may be defined to penetrate the second substrate SUB2. Accordingly, the depth HT3 of which each of the plurality of recessed patterns RPT is recessed from the lower surface of the base substrate SUB may substantially be the same as a thickness HT2 of the second substrate SUB2.

The first non-conductive layer AF-D may be disposed between the display panel DP and the driving chip DC. The first non-conductive layer AF-D according to an embodiment may have non-conductive properties. For example, the first non-conductive layer AF-D may not include conductive particles. The first non-conductive layer AF-D may fill between the first pad DP-PD1 and the first bump DC-PD1 bonded to each other.

The base substrate SUB may include an overlapping portion AP-R and a non-overlapping portion AP-C. The overlapping portion AP-R is a portion overlapping the plurality of recessed patterns RPT, and the non-overlapping portion AP-C is a portion not overlapping the plurality of recessed patterns RPT. For example, the non-overlapping portion AP-C is a portion overlapping the plurality of convex patterns CVP. The base substrate SUB may include the overlapping portion AP-R and the non-overlapping portion AP-C alternately disposed in the second direction DR2.

In the base substrate SUB, the non-overlapping portion AP-C corresponds to a region not overlapping the plurality of recessed patterns RPT but overlapping the plurality of convex patterns CVP, and the remaining amount of the first non-conductive layer AF-D remaining between the first pad DP-PD1 and the first bump DC-PD1 in the non-overlapping portion AP-C may be smaller than the remaining amount of the first non-conductive layer AF-D remaining between the first pad DP-PD1 and the first bump DC-PD1 in the overlapping portion AP-R. For example, a bonding surface of the first pad DP-PD1 and the first bump DC-PD1 in the non-overlapping portion AP-C may have a larger effective contact area than a bonding surface of the first pad DP-PD1 and the first bump DC-PD1 in the overlapping portion AP-R.

The display panel DP may further include the first coating pattern portion CP1 filling the plurality of recessed patterns RPT. The first coating pattern portion CP1 may be completely filled in the plurality of recessed patterns RPT. The height of the first coating pattern portion CP1 may substantially be the same as the depth HT3 of the plurality of recessed patterns RPT. Accordingly, each of lower surfaces of the first coating pattern portions CP1 may be disposed to be parallel to the lower surface of the base substrate SUB. For example, the first coating pattern portion CP1 is filled in each of the plurality of recessed patterns RPT, so that the lower surface of the base substrate SUB is flat, and thus, there may be no step shape in a lower portion of the base substrate SUB. In the descriptions, the phase "substantially the same" means not only that numerical values of the thickness, length, width, and the like of each component are completely the same, but also that the numerical values thereof are the same within a range including differences which may be caused by process errors despite the same design.

The first coating pattern portion CP1 may include an insulating material such as a pressure sensitive adhesive (PSA) film, an optically clear adhesive (OCA) film, or an optically clear resin (OCR). In addition, the first coating pattern portion CP1 may also include a metallic material. For example, although not particularly limited, the metallic material may include at least one among steel, carbon steel, special steel, stainless steel, cast iron, steel casting, and invar. However, embodiments are not limited thereto.

Figure 10B:
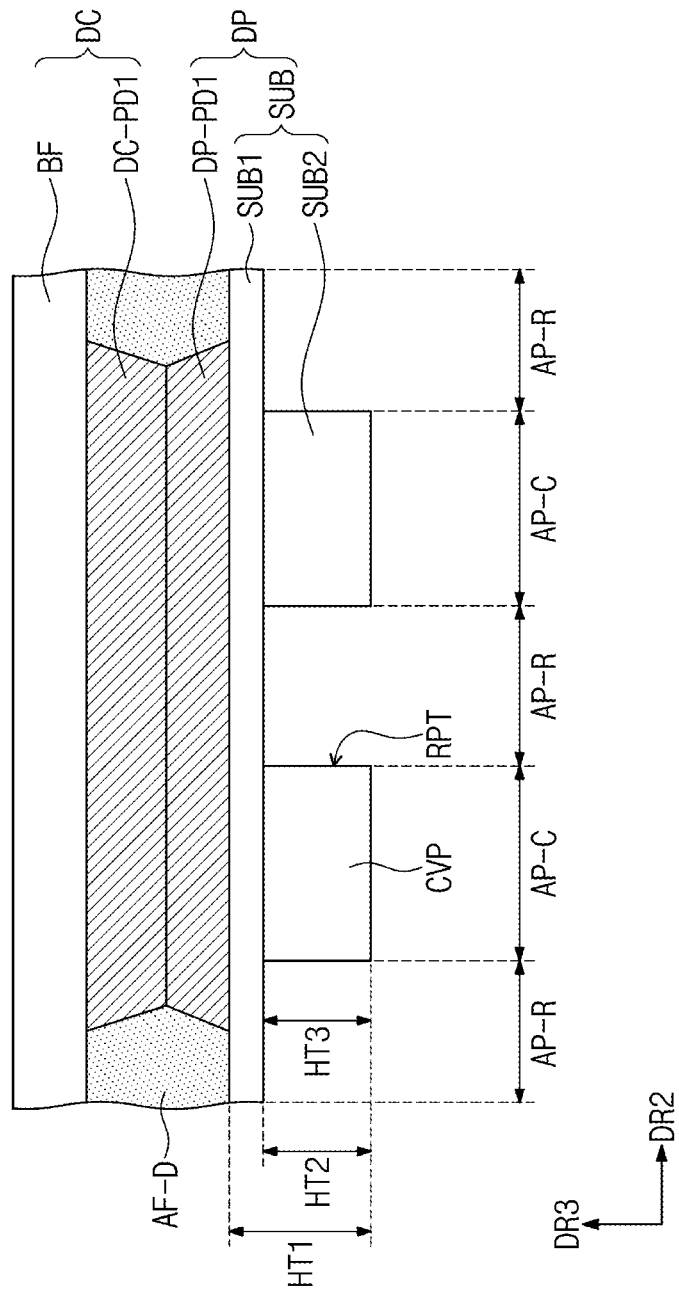
FIGS. 10B, 10C, and 10D are cross-sectional views illustrating other examples of the connection between the driving chip and the display pads of FIG. 7.
Figure 10C:
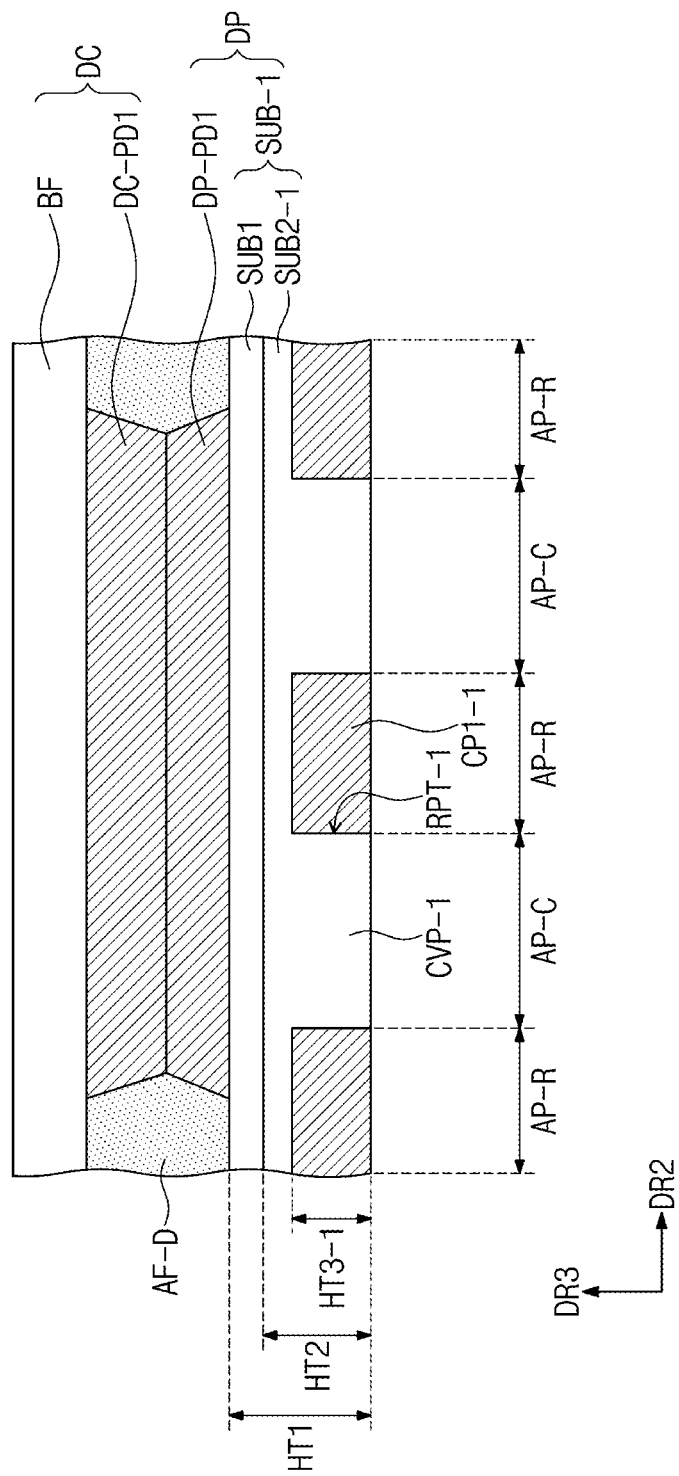
Figure 10D:
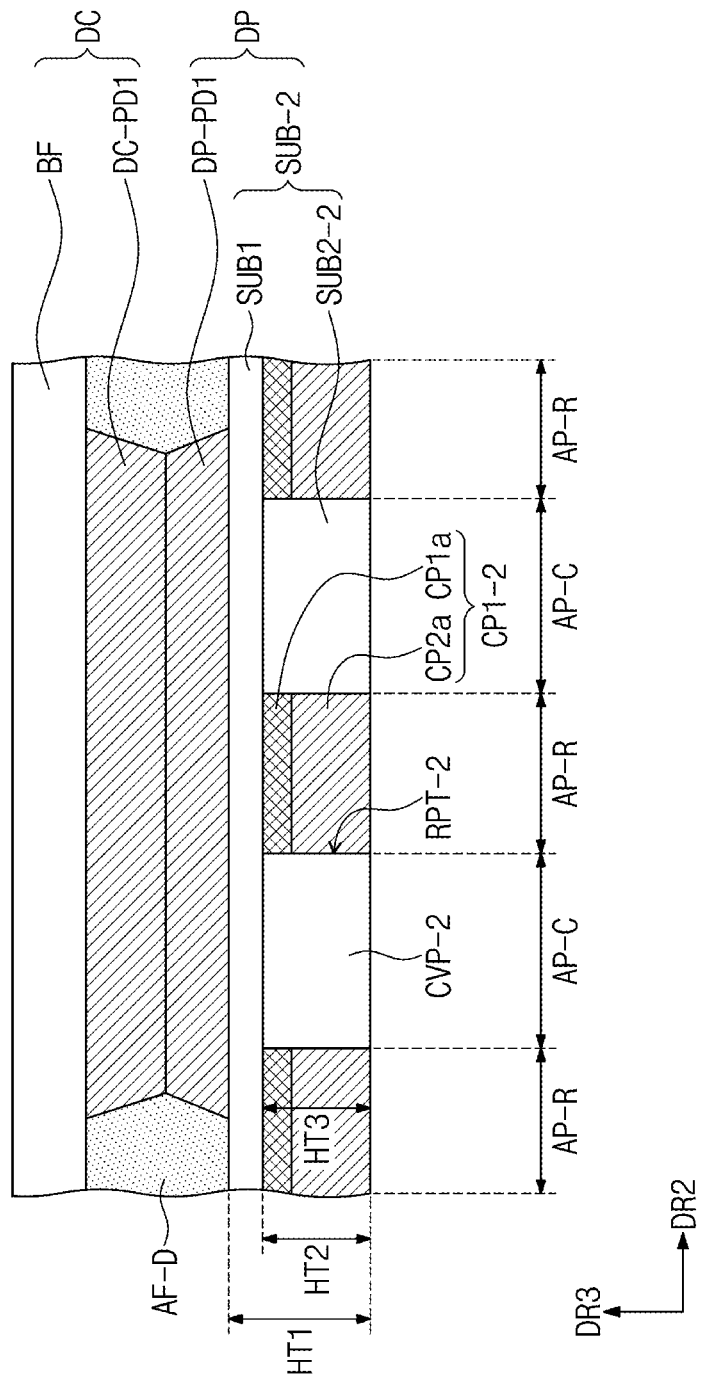

FIGS. 10B, 10C, and 10D are cross-sectional views illustrating a portion of a display device according to another embodiment. Hereinafter, in describing a display device according to an embodiment with reference to FIGS. 10B, 10C, and 10D, the same reference numerals are given to components which are the same as those described above and detailed descriptions thereof will be omitted for descriptive convenience.

Referring to FIG. 10B, the display panel DP of a display device according to an embodiment may not include the first coating pattern portion CP1. Since the first coating pattern portion CP1 is not filled in the plurality of recessed patterns RPT, there may be a step shape in the lower portion of the base substrate SUB. In this case, the step formed in the lower portion of the base substrate SUB may be the same as the depth HT3 of the plurality of recessed patterns RPT.

Referring to FIG. 10C, in the display device according to an embodiment, each of a plurality of recessed patterns RPT-1 formed in a base substrate SUB-1 of the display panel DP may be recessed from a lower surface of a second substrate SUB2-1, and a depth HT3-1 of which each of the plurality of recessed patterns RPT-1 is recessed from the lower surface of the second substrate SUB2-1 may be less than a thickness HT2 of the second substrate SUB2-1. Since the depth HT3-1 of which each of the plurality of recessed patterns RPT-1 is recessed from the lower surface of the second substrate SUB2-1 is less than the thickness HT2 of the second substrate SUB2-1, in the display device according to an embodiment, the damage to the display panel DP during a compression process may be minimized or prevented, and as a result, the durability of the display device may be further improved or enhanced.

The first coating pattern portion CP1-1 may be completely filled in the plurality of recessed patterns RPT-1. Accordingly, each of lower surfaces of the first coating pattern portions CP1-1 may be disposed to be parallel to a lower surface of the base substrate SUB-1.

Referring to FIG. 10D, in the display device according to an embodiment, a plurality of recessed patterns RPT-2 which are recessed from a lower surface of a base substrate SUB-2 may be formed in the base substrate SUB-2. Each of the plurality of recessed patterns RPT-2 may be recessed to a predetermined thickness or a predetermined depth from a lower surface of the second substrate SUB2-2. The plurality of recessed patterns RPT-2 may be formed to penetrate the second substrate SUB2-2. Accordingly, a depth HT3 of which each of the plurality of recessed patterns RPT-2 is recessed from the lower surface of the second substrate SUB2-2 may substantially be the same as a thickness HT2 of the second substrate SUB2-2. However, embodiments are not limited thereto. The depth HT3 of which each of the plurality of recessed patterns RPT-2 is recessed from the lower surface of the second substrate SUB2-2 may less than the thickness HT2 of the second substrate SUB2-2.

The base substrate SUB-2 may include a plurality of convex patterns CVP-2 formed between the plurality of recessed patterns RPT-2. The plurality of recessed patterns RPT-2 and the plurality of convex patterns CVP-2 may be alternately disposed along the second direction DR2.

The display panel DP may include a first coating pattern portion CP1-2 filling the plurality of recessed patterns RTP-2, and the first coating pattern portion CP1-2 may include a first sub-coating pattern portion CP1a adjacent to the first pad DP-PD1 and a second sub-coating pattern portion CP2a disposed below the first sub-coating pattern portion CP1a.

The second sub-coating pattern portion CP2a may have a hardness greater than the hardness of the first sub-coating pattern portion CP1a. The second sub-coating pattern portion CP2a may include a material having a higher rigidity than the first sub-coating pattern portion CP1a.

In an embodiment, the first sub-coating pattern portion CP1a may include a pressure sensitive adhesive (PSA) film, an optically clear adhesive (OCA) film, an optically clear resin (OCR), or the like. The second sub-coating pattern portion CP2a may include a metallic material. For example, the metallic material may include at least one among steel, stainless steel, cast iron, steel casting, carbon steel, and invar. However, embodiments are not limited thereto.

The descriptions of the plurality of first display pads DP-PD and the plurality of bumps DC-PD in the first pad region PA1 given with reference to FIGS. 10A, 10B, 10C, and 10D and the like may be equally applied to the plurality of second display pads DP-CPD and the plurality of circuit pads CF-PD in the second pad region PA2. For example, at least any one of the plurality of recessed patterns RPT may overlap the second pad region PA2, and at least a portion of each of the plurality of convex patterns CVP formed between the plurality of recessed patterns PRT may overlap the plurality of second display pads DP-CPD. In addition, the base substrate SUB overlapping the second pad region PA2 may include the overlapping portion AP-R, which is a region overlapping the plurality of recessed patterns RPT, and the non-overlapping portion AP-C, which is a region not overlapping the plurality of recessed patterns RPT but overlapping the plurality of convex patterns CVP. Accordingly, a bonding surface of the plurality of second display pads DP-CPD and the plurality of circuit pads CF-PD in the non-overlapping portion AP-C may have a larger effective contact area than a bonding surface of the plurality of second display pads DP-CPD and the plurality of circuit pads CF-PD in the overlapping portion AP-R.

Figure 11A:
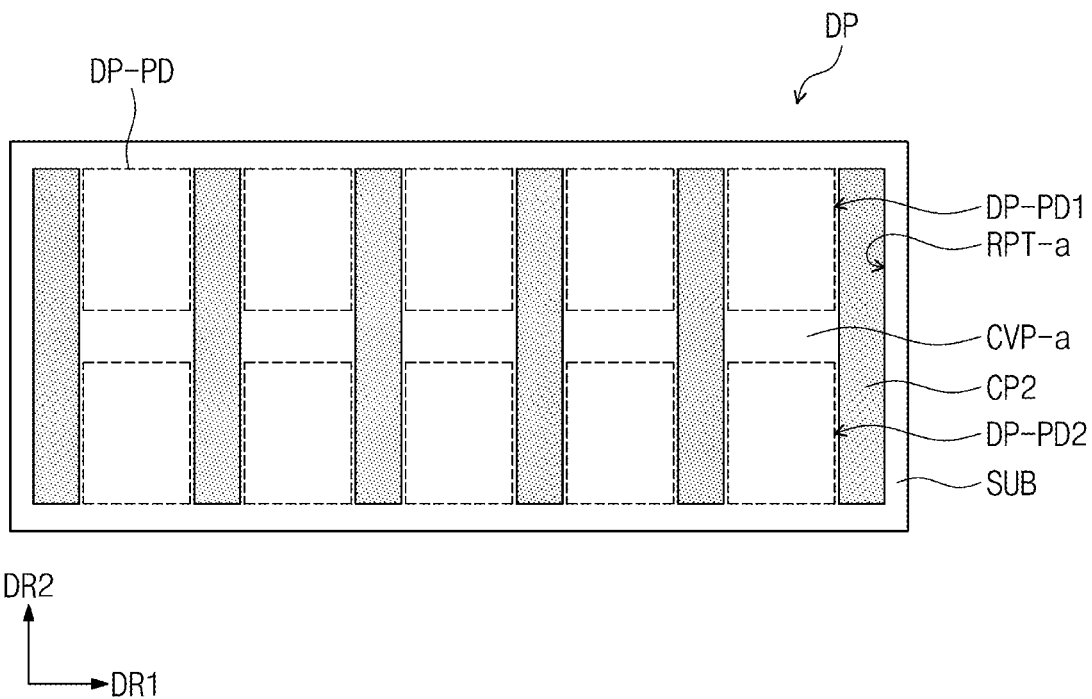
FIGS. 11A and 11B are plan views of other examples of the display pads of FIG. 9.
Figure 11B:
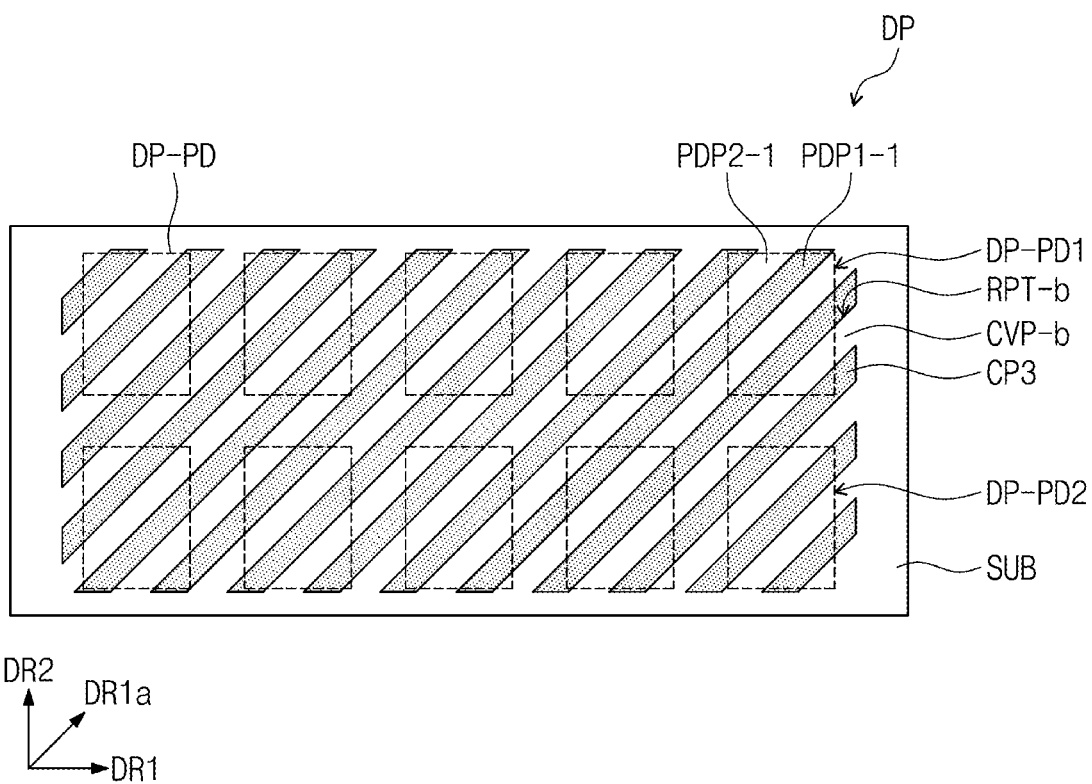

FIGS. 11A and 11B illustrate plan views of the display panel DP according to another embodiment.

Referring to FIG. 11A, on the base substrate SUB, a plurality of recessed patterns RPT-a which are recessed to a predetermined thickness or a predetermined depth from the lower surface thereof may be defined. The plurality of recessed patterns RPT-a may be spaced apart from each other along the first direction DR1 and extended in the second direction DR2. The plurality of recessed patterns RPT-a may not overlap the plurality of first display pads DP-PD on a plane. A plurality of convex patterns CVP-a may be formed between the plurality of recessed patterns RPT-a. The plurality of convex patterns CVP-a may overlap the plurality of first display pads DP-PD. The plurality of convex patterns CVP-a may completely overlap the plurality of first display pads DP-PD. The plurality of recessed patterns RPT-a and the plurality of convex patterns CVP-a may be alternately disposed along the first direction DR1.

A second coating pattern portion CP2 may be filled in the plurality of recessed patterns RPT-a. The second coating pattern portion CP2 may be completely filled in each of the plurality of recessed patterns RPT-a. For example, the second coating pattern portion CP2 may include a third sub-coating pattern portion adjacent to the plurality of first display pads DP-PD and a fourth sub-coating pattern portion disposed below the third sub-coating pattern portion. In addition, the above descriptions of the first sub-coating pattern portion and the second sub-coating pattern portion may be equally applied to the third sub-coating pattern part and the fourth sub-coating pattern part, respectively.

Referring to FIG. 11B, on the base substrate SUB, a plurality of recessed patterns RPT-b which are recessed to a predetermined thickness from the lower surface of the base substrate SUB may be defined. The base substrate SUB may include a plurality of convex patterns CVP-b formed between the plurality of recessed patterns RPT-b. The plurality of recessed patterns RPT-b may be spaced apart along the first direction DR1, and may be extended in a first sub-direction DR1a, which is a direction crossing the first direction DR1 and the second direction DR2. The plurality of convex patterns CVP-b may be disposed spaced apart along the first direction DR1, and may be extended in the first sub-direction DR1a, which is a direction crossing the first direction DR1 and the second direction DR2. The plurality of recessed patterns RPT-b and the plurality of convex patterns CVP-b may be alternately disposed along the first direction DR1.

Each of the plurality of first display pads DP-PD may include a first pad portion PDP1-1 overlapping the plurality of recessed patterns RPT-b, and a second pad portion PDP2-1 not overlapping the plurality of recessed patterns RPT-b but overlapping the plurality of convex patterns CVP-b.

Figure 13A:
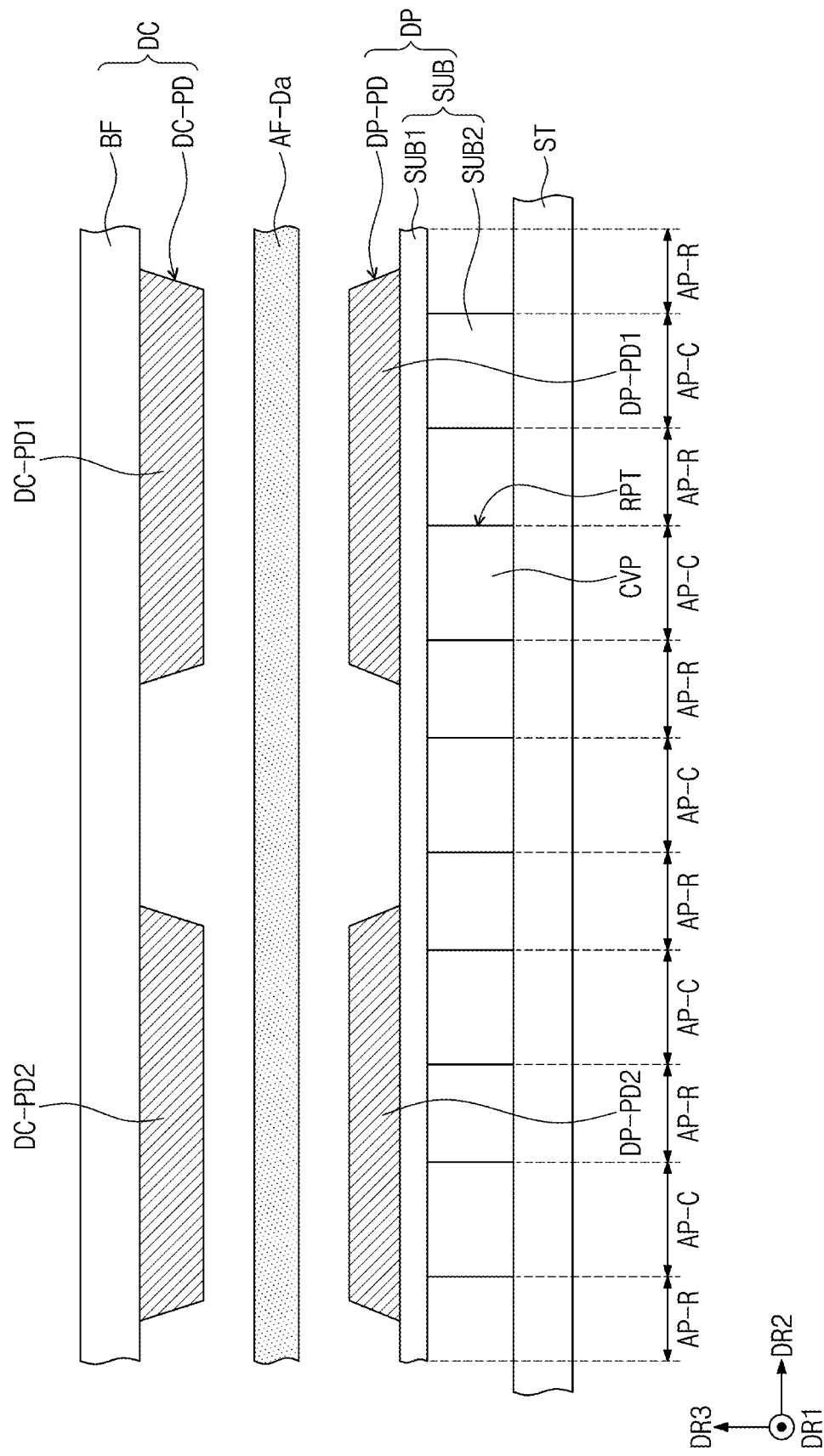
FIGS. 13A, 13B, and 13C are schematic views showing steps of the method of manufacturing the display device of FIG. 12.
Figure 13B:
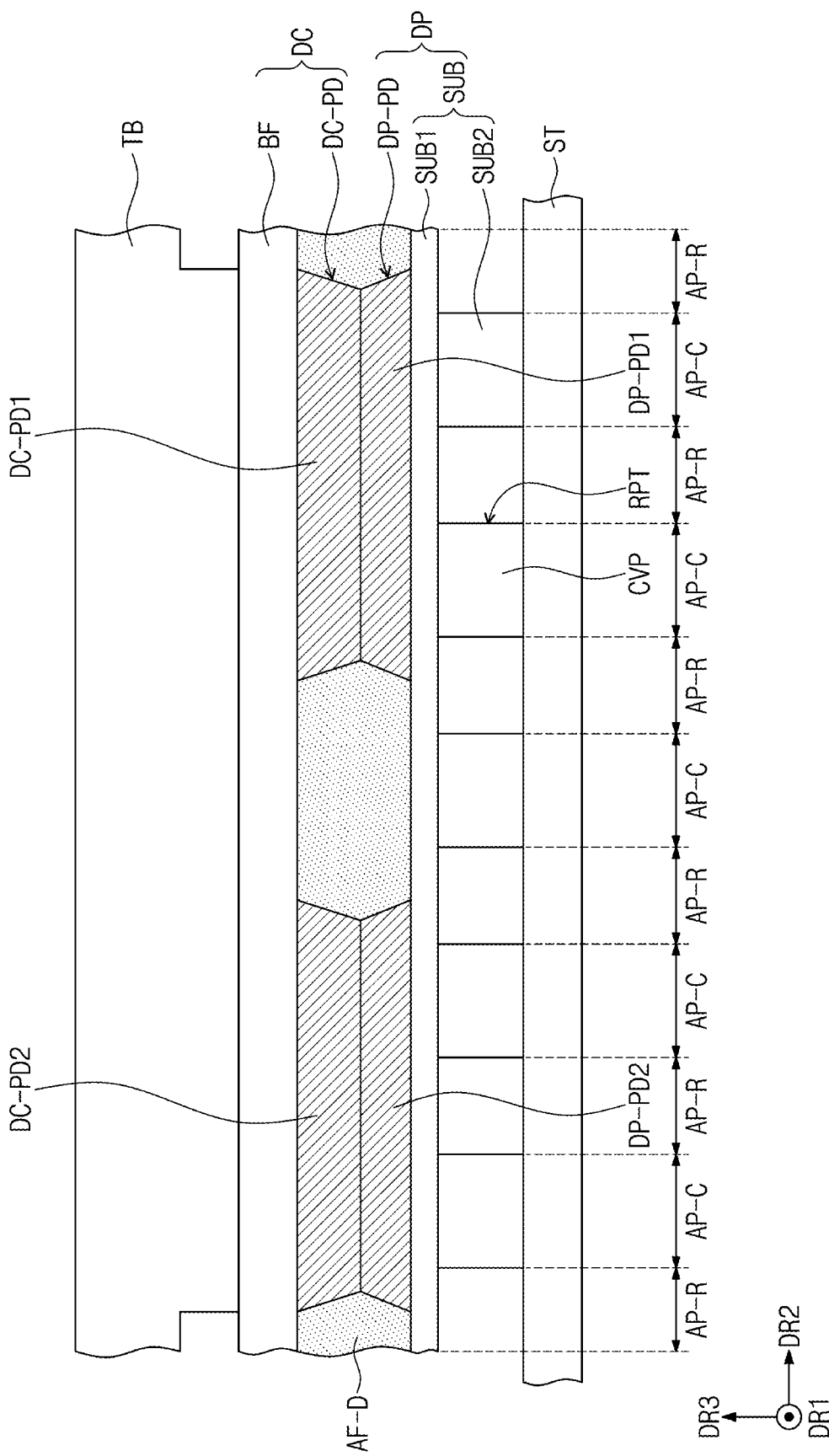
Figure 13C:
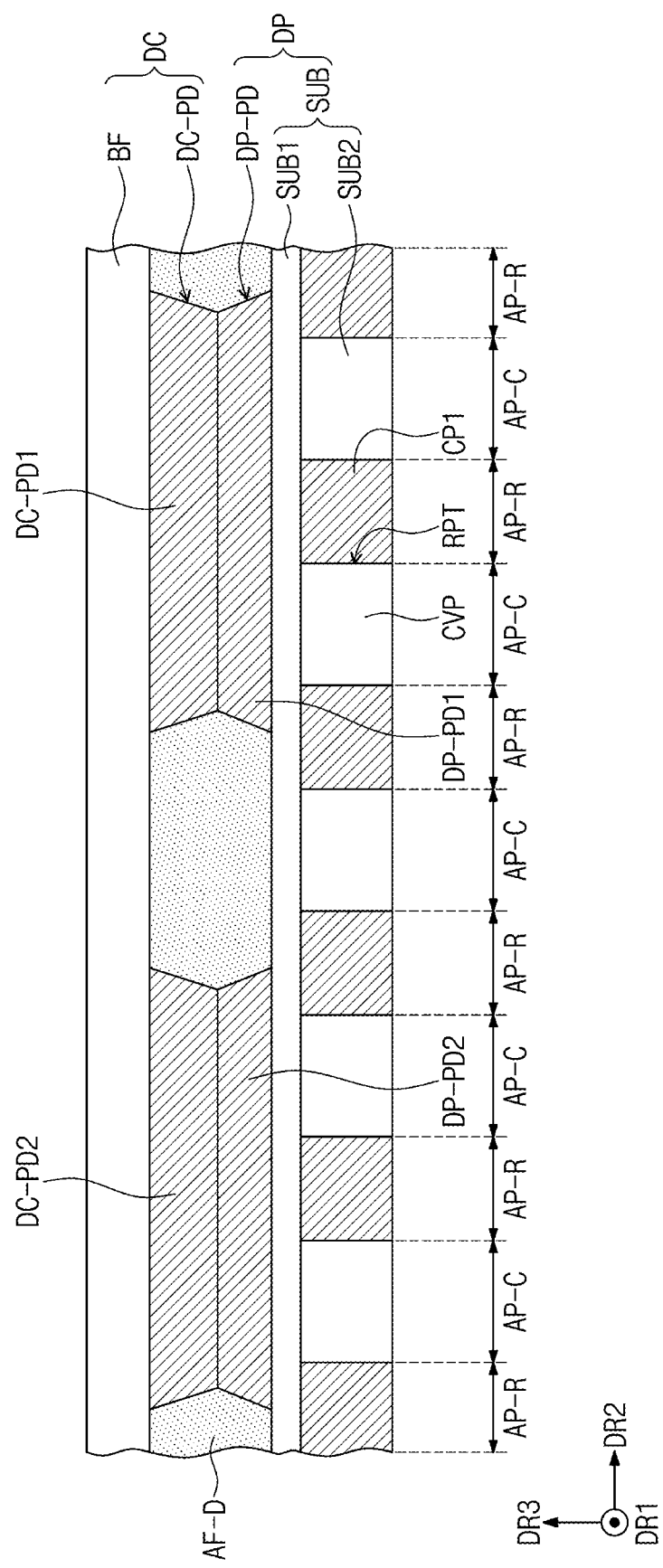

Hereinafter, referring to FIGS. 12, 13A, 13B, and 13C and the like, a method of manufacturing a display device of an embodiment will be described. In the following description of the method of manufacturing a display device of an embodiment, the same contents as those described above with reference to the display device of an embodiment will not be repeated. Instead, the description will mainly focus on differences. FIGS. 13A, 13B, and 13C exemplarily illustrate cross-sections corresponding to one first pad DP-PD1 and one second pad DP-PD2 disposed in the first pad area PA1 (see FIG. 7).

FIG. 12 is a flowchart showing a method of manufacturing a display device of an embodiment. FIGS. 13A, 13B, and 13C are respectively views schematically showing some of the steps corresponding to steps of the manufacturing method of an embodiment illustrated in FIG. 12. Hereinafter, a method of bonding the driving chip DC and the display panel DP through the first non-conductive layer AF-D is illustrated through FIGS. 13A, 13B, and 13C. However, a method of bonding a flexible circuit board PB (see FIG. 7) and the display panel DP through the second non-conductive layer AF-C (see FIG. 7) may substantially be the same.

Referring to FIG. 12, a method of manufacturing a display device of an embodiment may include Step S100 of providing a display panel including a base substrate including a plurality of recessed patterns which are recessed from a lower surface defined thereon, and a plurality of display pads disposed on a upper surface of the base substrate, Step S200 of aligning a plurality of bumps included in a circuit board with the plurality of display pads, Step S300 of electrically connecting the plurality of bumps to the plurality of display pads, and Step S400 of forming a first coating pattern portion in the plurality of recessed pattern.

FIG. 13A schematically illustrate Step S100 of providing a display panel including a base substrate including a plurality of recessed patterns which are recessed from a lower surface defined thereon, and a plurality of display pads disposed on an upper surface of the base substrate, and Step S200 of aligning a plurality of bumps included in a circuit board with the plurality of display pads.

Referring to FIG. 13A, a display panel DP including a base substrate SUB and a plurality of first display pads DP-PD disposed on an upper surface of the base substrate SUB may be disposed on a stage ST. On the base substrate SUB, a plurality of recessed patterns RPT which are recessed from a lower surface of the base substrate SUB may be defined. The base substrate SUB may include a plurality of convex patterns CVP formed between the plurality of recessed patterns RPT. Accordingly, the base substrate SUB may include an overlapping portion AP-R, which is a region overlapping the plurality of recessed patterns RPT, and a non-overlapping portion AP-C, which is a region not overlapping the plurality of recessed patterns RPT but overlapping the plurality of convex patterns CVP.

On the display panel DP, a driving chip DC including a base layer BF and a plurality of bumps DC-PD disposed on a lower surface of the base layer BF may be provided. For example, on the first pad DP-PD1 and the second pad DP-PD2 of the display panel DP, the driving chip DC including a first bump DC-PD1 and a second bump DC-PD2 respectively corresponding to the first pad DP-PD1 and the second pad DP-PD2 may be provided. A first preliminary non-conductive layer AF-Da may be provided between the display panel DP and the driving chip DC. The display panel DP, the preliminary non-conductive layer AF-Da, and the driving chip DC may be sequentially disposed on the stage ST.

In the descriptions, the preliminary non-conductive layer AF-Da refers to a state prior to being transformed to a final first non-conductive layer AF-D which couples the display panel DP and the driving chip DC to each other. In addition, the top surface of the stage ST may be parallel to a plane defined by a first direction DR1 and a second direction DR2.

FIG. 13B is a view schematically showing Step S300 of electrically connecting the plurality of bumps to the plurality of display pads.

Referring to FIGS. 13A and 13B, Step S300 of electrically connecting the plurality of bumps to the plurality of display pads may be a step of applying heat and pressure to the driving chip DC to bond the display panel DP, the preliminary non-conductive layer AF-Da, and the driving chip DC sequentially stacked on the stage ST. For example, by thermally pressing the driving chip DC through a heating bar TB, the display panel DP, the preliminary non-conductive layer AF-Da, and the driving chip DC may be pressed.

The pressing direction of the heating bar TB is a third direction DR3 perpendicular to the stage ST, and the display panel DP, the first preliminary non-conductive layer AF-Da, and the driving chip DC may be pressed and heated under high temperature and high pressure conditions on an upper side of the driving chip DC. Since the heating bar TB having a predetermined temperature is used to perform thermal compression, the first bump DC-PD1 and the second bump DC-PD2 may penetrate the first preliminary non-conductive layer AF-Da to respectively contact the first pad DP-PD1 and the second pad DP-PD2. For example, through the thermal pressure applied from an upper portion of the driving chip DC, the first bump DC-PD1 and the second bump DC-PD2 may be electrically connected to the first pad DP-PD1 and the second pad DP-PD2, respectively. At this time, the first preliminary non-conductive layer AF-Da overlapping between the first pad DP-PD1 and the first bump DC-PD1 and between the second pad DP-PD2 and the second bump DC-PD2 may be moved to another space. Thereafter, the first preliminary non-conductive layer AF-Da may be hardened and transformed to the first non-conductive layer AF-D of FIG. 13B which fills between the first pad DP-PD1 and the first bump DC-PD1 which are in contact with each other and between the second pad DP-PD2 and the second bump DC-PD2 which are in contact with each other.

During the compression process, in each of a contact surface of the first pad DP-PD1 and the first bump DC-PD1 and a contact surface of the second pad DP-PD2 and the second bump DC-PD2, a surface overlapping the overlapping portion AP-R may be defined as a first contact surface, and a surface overlapping the non-overlapping portion AP-C may be defined as a second contact surface. The second contact surface may overlap the plurality of convex patterns CVP, and thus, may have a greater load pressure received by the heating bar TB than the first contact surface overlapping the plurality of recessed patterns RPT. Accordingly, after the compression process, the second contact surface may have a larger effective contact area between the plurality of first display pads DP-PD and the plurality of bumps DC-PD and less contact resistance than the first contact surface.

FIG. 13C is a view schematically showing Step S400 of forming a first coating pattern portion in the plurality of recessed pattern.

Referring to FIG. 13C, a first coating pattern portion CP1 may be filled in each of the plurality of recessed patterns RPT defined on the lower surface of the base substrate SUB. The first coating pattern portion CP1 may be provided in a liquid phase and fill a space defined by each of the plurality of recessed patterns RPT. Thereafter, the first coating pattern portion CP1 filled in each of the plurality of recessed patterns RPT may be hardened to form the first coating pattern portion CP1 on a lower portion of the display panel DP as illustrated in FIG. 13C. Since the first coating pattern portion CP1 is formed by being filled to correspond to the shape of each of the plurality of recessed patterns RPT and then hardened by heat or light, there may be no step formed on a lower surface of the base substrate SUB. However, a method of forming the first coating pattern portion CP1 is not limited thereto, and may be variously changed depending on the type of material forming first coating pattern portion CP1.

When a non-conductive adhesive member is used for connecting a typical display panel and a circuit board, a separation phenomenon between a pad and a bump may occur due to the adhesive member remaining between the pad and the bump during a compression process. In order to prevent the separation phenomenon between the pad and the bump, a method of increasing a compressive load during the compression process may be used. However, in this method, stress may be concentrated in a portion in which the pad and the bump overlap, so that a crack may be formed between the pad and the bump or at an edge, which may result in damaging a display device. In addition, a height difference may be generated between the pad and the bump due to manufacturing process errors, and the height difference may cause a short-circuit between the pad and the bump during the compression process.

According to an embodiment, in a pad region including a plurality of display pads, a plurality of recessed patterns which are recessed from a lower surface of a base substrate may be formed in the base substrate, and a plurality of convex patterns may be formed between the plurality of recessed patterns. In a contact surface between the plurality of display pads and a plurality of bumps, an effective contact area of a non-overlapping portion overlapping the plurality of convex patterns may be increased more than an effective contact area of an overlapping portion overlapping the plurality of recessed patterns, so that the contact resistance between the plurality of display pads and the plurality of bumps may decrease. In addition, in a region overlapping the plurality of convex patterns, a compressive load may be selectively increased in the plurality of display pads and the plurality of bumps to minimize a non-conductive layer remaining between a pad and a bump. Furthermore, since the compressive load may be selectively increased in the non-overlapping portion, stress concentration generated during a thermal compression process may be alleviated to prevent damage to the display device, and even if there is a height difference of a pad or a bump, the step may be corrected, so that the connection reliability of the display device may be further improved.

According to an embodiment, a display device may include a base substrate including a plurality of recessed patterns overlapping a pad region of a display panel defined thereon. In a process of bonding a driving chip and the display panel, a region not overlapping the plurality of recessed patterns may be increased due to selectively concentrated load. As a result, an electrical contact between a pad and a bump may be facilitated, and the connection reliability between the driving chip and the display panel may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel having a display region and a pad region adjacent to the display region; and
a circuit board electrically connected to the display panel, wherein the display panel comprises:
a base substrate comprising an upper surface and a lower surface opposing the upper surface, the base substrate comprising a plurality of recessed patterns recessed from the lower surface of the base substrate; and
a plurality of display pads disposed on the upper surface of the base substrate, the plurality of display pads disposed in the pad region and arranged in a first direction, and wherein at least one of the plurality of recessed patterns overlaps the pad region,
wherein the base substrate comprises:
a first substrate disposed below the plurality of display pads and having an upper surface corresponding to the upper surface of the base substrate; and
a second substrate disposed below the first substrate and having a lower surface corresponding to the lower surface of the base substrate, and
wherein each of the plurality of recessed patterns is formed in the second substrate with depths the same as a thickness of the second substrate.

2. The display device of claim 1, wherein the plurality of recessed patterns extend in the first direction, and are spaced apart along a second direction intersecting the first direction.

3. The display device of claim 1, wherein a depth of each of the plurality of recessed patterns is less than a thickness of the base substrate.

4. The display device of claim 1, wherein each of the plurality of display pads comprises:
a first pad portion overlapping the plurality of recessed patterns; and
a second pad portion not overlapping the plurality of recessed patterns.

5. The display device of claim 1, wherein the circuit board comprises a plurality of bumps respectively overlapping the plurality of display pads, and
wherein each of the plurality of bumps is in contact with each of the plurality of display pads.

6. The display device of claim 1, further comprising a non-conductive layer disposed between the circuit board and the display panel.

7. The display device of claim 1, wherein the display panel further comprises a first coating pattern portion filled in the plurality of recessed patterns, and
wherein a height of the first coating pattern portion is substantially same as a depth of each of the plurality of recessed patterns.

8. The display device of claim 7, wherein the first coating pattern portion comprises:
a first sub-coating pattern portion disposed below the plurality of display pads; and
a second sub-coating pattern portion disposed below the first sub-coating pattern portion, and
wherein a hardness of the second sub-coating pattern is greater than a hardness of the first sub-coating pattern.

9. The display device of claim 1, wherein each of the plurality of recessed patterns is formed to penetrate the second substrate.

10. The display device of claim 1, wherein the plurality of recessed patterns do not overlap the plurality of display pads, extend in a second direction intersecting the first direction, and are spaced apart from each other in the first direction.

11. The display device of claim 10, wherein the display panel further comprises a second coating pattern portion filled in the plurality of recessed patterns.

12. The display device of claim 1, wherein each of the plurality of recessed patterns extends in a first sub-direction inclined at a predetermined angle with respect to the first direction.

13. A display device comprising:
a circuit board; and
a display panel electrically connected to the circuit board, the display panel comprising:
a base substrate having an upper surface and a lower surface opposing the upper surface, the base substrate comprising a plurality of recessed patterns recessed from the lower surface of the base substrate, and
a plurality of display pads disposed on the upper surface of the base substrate and arranged in a first direction,
wherein the base substrate comprises a plurality of convex patterns formed between the plurality of recessed patterns, and
wherein at least a portion of each of the plurality of convex patterns overlaps the plurality of display pads in a plan view,
wherein the base substrate comprises:
a first substrate disposed below the plurality of display pads and having an upper surface corresponding to the upper surface of the base substrate; and
a second substrate disposed below the first substrate and having a lower surface corresponding to the lower surface of the base substrate, and
wherein each of the plurality of recessed patterns is formed in the second substrate with depths the same as a thickness of the second substrate.

14. The display device of claim 13, wherein the plurality of convex patterns extend in the first direction, and are spaced apart from each other in a second direction intersecting the first direction.

15. The display device of claim 13, wherein each of the plurality of display pads comprises:
a first pad portion not overlapping the plurality of convex patterns; and
a second pad portion overlapping the plurality of convex patterns.

16. The display device of claim 13, wherein the plurality of recessed patterns do not overlap the plurality of display pads, are spaced apart from each other in the first direction, and extend in a second direction intersecting the first direction.

17. The display device of claim 13, further comprising a non-conductive layer disposed between the circuit board and the display panel.

18. A method of manufacturing a display device according to the display device of claim 1, the method comprising the steps of:
- providing the display panel comprising:
    - the base substrate having the upper surface and the lower surface opposing the upper surface, the base substrate comprising the plurality of recessed patterns recessed from the lower surface, and
    - the plurality of display pads disposed on the upper surface of the base substrate;
- providing the circuit board comprising a plurality of bumps overlapping the plurality of display pads;
- applying thermal pressure to the circuit board to electrically connect the plurality of bumps to the plurality of display pads; and
- forming a first coating pattern portion in the plurality of recessed pattern,
- wherein at least a portion of each of a plurality of convex patterns formed between the plurality of recessed patterns overlaps the plurality of display pads.

* * * * *